(12) United States Patent
Maebashi

(10) Patent No.: US 8,058,708 B2
(45) Date of Patent: Nov. 15, 2011

(54) THROUGH HOLE INTERCONNECTION STRUCTURE FOR SEMICONDUCTOR WAFER

(75) Inventor: Takanori Maebashi, Asaka (JP)

(73) Assignee: Honda Motor Co., Ltd., Tokyo (JP)

( * ) Notice: Subject to any disclaimer, the term of this patent is extended or adjusted under 35 U.S.C. 154(b) by 254 days.

(21) Appl. No.: 12/194,670

(22) Filed: Aug. 20, 2008

(65) Prior Publication Data

US 2009/0051012 A1 Feb. 26, 2009

Related U.S. Application Data

(60) Provisional application No. 60/957,791, filed on Aug. 24, 2007.

(51) Int. Cl.
*H01L 23/538* (2006.01)

(52) U.S. Cl. ........ 257/621; 257/773; 257/774; 257/775; 257/777; 257/E23.169; 257/E23.174; 257/E23.175

(58) Field of Classification Search .................. 257/621, 257/E23.169, E23.174, E23.175, 773, 774, 257/775, 777

See application file for complete search history.

(56) References Cited

U.S. PATENT DOCUMENTS

| | | | |
|---|---|---|---|
| 5,998,808 A * | 12/1999 | Matsushita | 257/74 |
| 7,132,731 B2 | 11/2006 | Wood et al. | |
| 7,525,186 B2 * | 4/2009 | Kim et al. | 257/686 |
| 7,679,179 B2 | 3/2010 | Jeung et al. | |
| 2002/0190371 A1* | 12/2002 | Mashino et al. | 257/690 |
| 2004/0188822 A1* | 9/2004 | Hara | 257/689 |
| 2004/0238927 A1* | 12/2004 | Miyazawa | 257/678 |
| 2005/0001320 A1* | 1/2005 | Yamaguchi | 257/758 |
| 2005/0017338 A1* | 1/2005 | Fukazawa | 257/686 |
| 2006/0118965 A1* | 6/2006 | Matsui | 257/774 |
| 2007/0134819 A1* | 6/2007 | Uchiyama | 438/3 |

FOREIGN PATENT DOCUMENTS

| | | |
|---|---|---|
| JP | 11-261000 A | 9/1999 |
| JP | 2007-59769 A | 3/2007 |
| WO | WO 2007/024022 A1 | 3/2007 |

\* cited by examiner

*Primary Examiner* — Eugene Lee
*Assistant Examiner* — Peniel M Gumedzoe
(74) *Attorney, Agent, or Firm* — Birch, Stewart, Kolasch & Birch, LLP

(57) ABSTRACT

A through-hole interconnection structure for a semiconductor wafer, in which: the each wafer includes at least a first wafer and a second wafer electrically connected to the first wafer; an electrical signal connecting section of the second wafer is provided to protrude from a bonding surface of the second wafer, the bonding surface being bonded with the first wafer; and the electrical signal connecting section has a cross section with a curved line or two or more straight lines extending in different directions when the second wafer is seen along a cross section parallel to the bonding surface.

20 Claims, 23 Drawing Sheets

THROUGH HOLE INTERCONNECTION STRUCTURE FOR SEMICONDUCTOR WAFER

This application claims priority of U.S. Provisional Patent Application No. 60/957,791 filed Aug. 24, 2007, which is incorporated herein by reference in its entirety.

BACKGROUND OF THE INVENTION

1. Field of the Invention

The present invention relates to a through-hole interconnection structure for a semiconductor wafer. More particularly, the present invention relates to a through-hole interconnection structure for a semiconductor wafer used in a semiconductor device which includes plural wafers stacked together.

2. Background Art

A three-dimensional semiconductor integrated circuit device has been known which includes two or more wafers stacked together and electrically connected via buried wiring. For example, Japanese Unexamined Patent Application, First Publication No. 2007-59769 discloses a semiconductor device in which a desired semiconductor circuit is provided by bonding plural substrates together and electrically connecting semiconductor circuit sections formed on each substrate. In the semiconductor device disclosed in Japanese Unexamined Patent Application, First Publication No. 2007-59769, a semiconductor circuit section of an upper substrate and a semiconductor circuit section of a lower substrate are bonded and electrically connected to each other with a through-hole interconnecting section exposed from a back surface of the upper substrate and a bump on a principal surface of the lower substrate being in contact.

That is, in a conventional semiconductor device which includes plural wafers bonded together, the wafers are electrically connected to each other via an electrical signal connecting section such as a through-hole interconnecting section and a bump which protrudes from a bonding surface. In particular, in the technique disclosed in Japanese Unexamined Patent Application, First Publication No. 2007-59769, the upper and lower substrates are electrically connected via a through-hole interconnecting section protruding from the back surface of the upper substrate and a bump protruding from the principal surface of the lower substrate.

In this case, however, in which plural wafers are electrically connected via the electrical signal connecting section protruding from the bonding surface, the electrical signal connecting section may be damaged at the time of wafer bonding. Damages to the electrical signal connecting section may cause deterioration in electrical conduction property and stability in the electrical signal connecting section or may cause deterioration in stability in dynamic characteristics of the semiconductor device. Thus, a semiconductor device with stable performance cannot often be obtained.

In view of the aforementioned, an object of the present invention is to provide a through-hole interconnection structure of a semiconductor wafer which has sufficient rigidity to withstand load it receives at the time of wafer bonding, in which electrical signal connecting section protruding from the bonding surface is less easily damaged, and is excellent in reliability and stability of performance.

SUMMARY OF THE INVENTION

In attempt to achieve the above object, the present inventors made intensive studies and found a through-hole interconnection structure which has excellent rigidity to withstand load it receives at the time of wafer bonding. The inventors have obtained the following knowledge.

A through-hole interconnection structure for a semiconductor wafer according to the present invention which includes a plurality of wafers bonded together, each of the plurality of wafers including a substrate with a device formed thereon, wherein: the each wafer includes at least a first wafer and a second wafer electrically connected to the first wafer; an electrical signal connecting section of the second wafer is provided to protrude from a bonding surface of the second wafer, the bonding surface being bonded with the first wafer; and the electrical signal connecting section has a cross section with a curved line or two or more straight lines extending in different directions when the second wafer is seen along a cross section parallel to the bonding surface.

According to the through-hole interconnection structure for the semiconductor wafer, the electrical signal connecting section has a cross section that exhibits sufficient rigidity to withstand the load it receives at the time of wafer bonding, e.g., at the time of bonding the first and second wafers to each other. Thus, the electrical signal connecting section is less easily damaged by the load caused due to wafer bonding.

For example, in the electrical signal connecting section having a transverse cross section with a straight line extending in one direction, the electrical signal connecting section may be easily damaged when it receives load at the time of wafer bonding in a direction perpendicular to the direction along which the straight line extends. In contrast, in the through-hole interconnection structure for the semiconductor wafer according to the invention, the transverse cross section of the electrical signal connecting section includes a curved line or two or more straight lines extending in different directions. With this configuration, in the electrical signal connecting section, as compared with a case where its transverse cross section includes a straight line extending in one direction, variation in rigidity to withstand the load among directions is small and thus the electrical signal connecting section is less easily damaged when it receives load at the time of wafer bonding.

A separating section which surrounds the electrical signal connecting section may be provided on and protrudes from the bonding surface.

The separating section and the electrical signal connecting section may be integrally formed.

Further, a contour of the separating section in a cross section parallel to the bonding surface may be similar to a contour of the electrical signal connecting section.

PREFERRED EMBODIMENTS

Figure 1A:
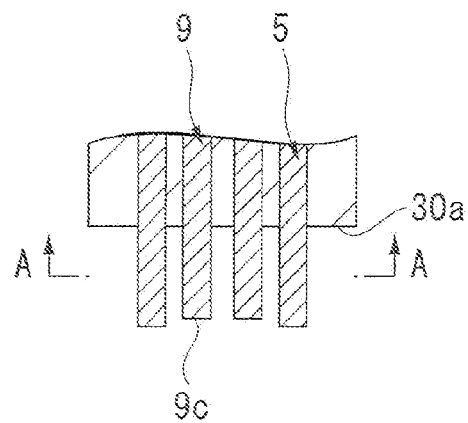
FIG. 1A illustrates an embodiment of a through-hole interconnection structure for a semiconductor wafer of the present invention, and is an enlarged longitudinal cross-sectional view of a vicinity of a bonding surface of an upper wafer 1WA which is a part of a semiconductor device shown in FIG. 3.

Referring now to the drawings, embodiments of a through-hole interconnection structure for a semiconductor wafer according to the present invention will be described.

First Embodiment

Figure 1B:
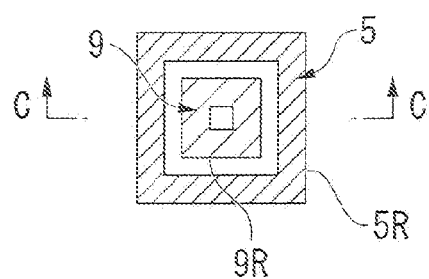
FIG. 1B is an enlarged transverse cross-sectional view of a through-hole separating section and a through-hole interconnecting section in the upper wafer 1WA.
Figure 1C:
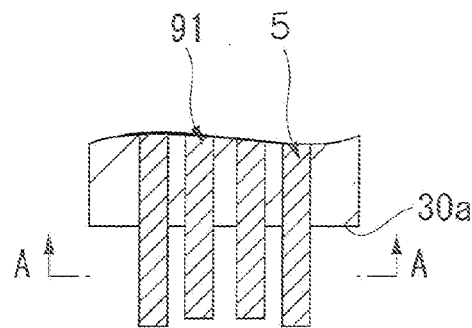
FIG. 1C is a cross-sectional view similar to FIG. 1A showing another exemplary configuration of the through-hole interconnecting section.
Figure 1D:
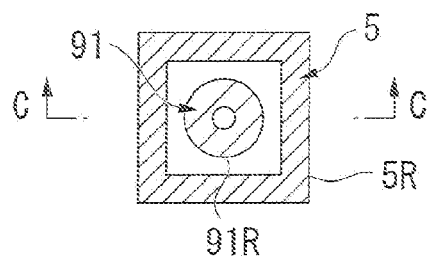
FIG. 1D is a cross-sectional view similar to FIG. 1B showing the same example as FIG. 1C.
Figure 2A:
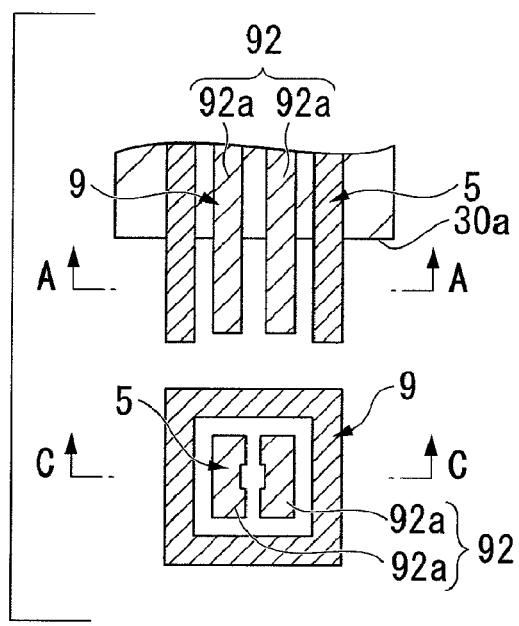
FIG. 2A is a cross-sectional view similar to FIGS. 1A and 1B showing another exemplary configuration of the through-hole interconnecting section.
Figure 2B:
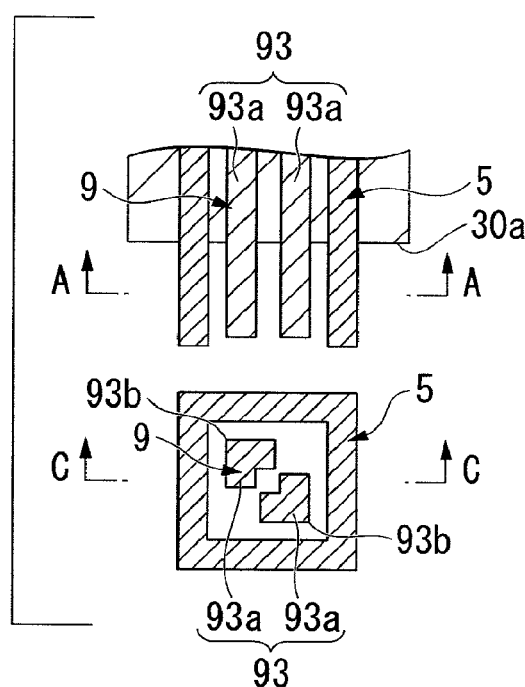
FIG. 2B is a cross-sectional view similar to FIGS. 1A and 1B showing a further exemplary configuration of the through-hole interconnecting section.
Figure 2C:
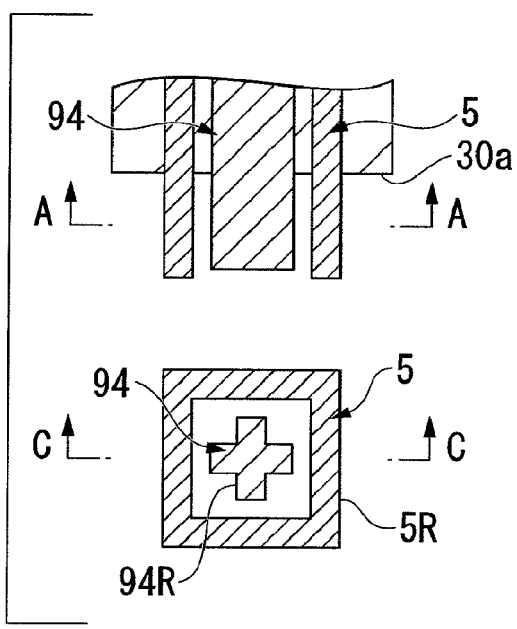
FIG. 2C is a cross-sectional view similar to FIGS. 1A and 1B showing a further exemplary configuration of the through-hole interconnecting section.
Figure 2D:
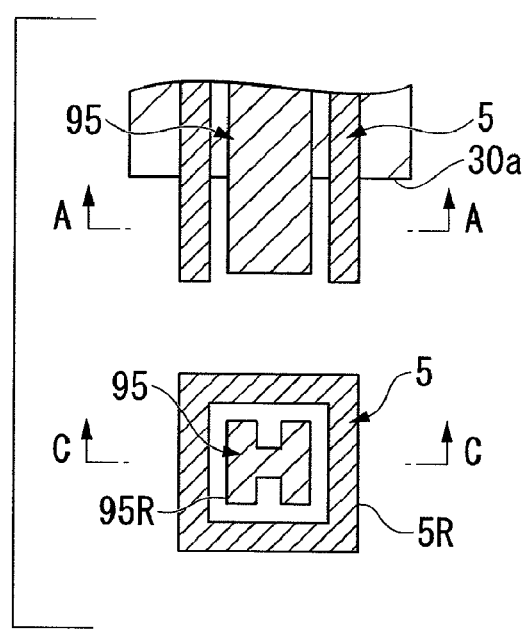
FIG. 2D is a cross-sectional view similar to FIGS. 1A and 1B showing a further exemplary configuration of the through-hole interconnecting section.
Figure 2E:
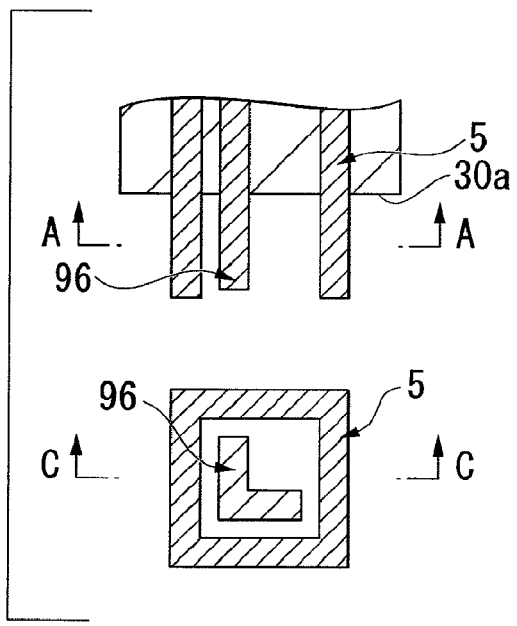
FIG. 2E is a cross-sectional view similar to FIGS. 1A and 1B showing a further exemplary configuration of the through-hole interconnecting section.
Figure 2F:
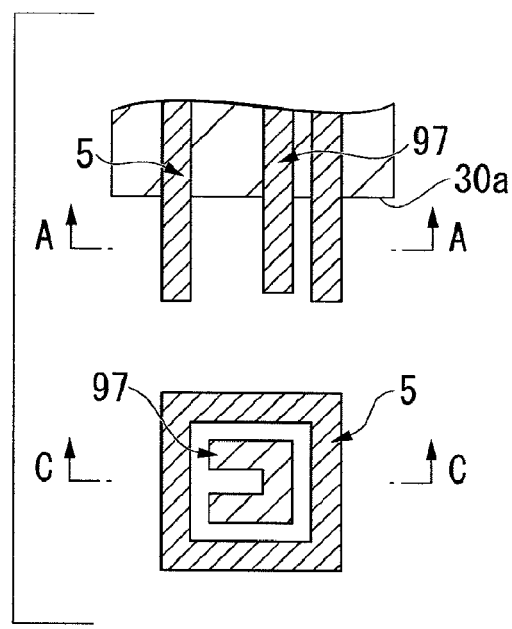
FIG. 2F is a cross-sectional view similar to FIGS. 1A and 1B showing a further exemplary configuration of the through-hole interconnecting section.
Figure 3:
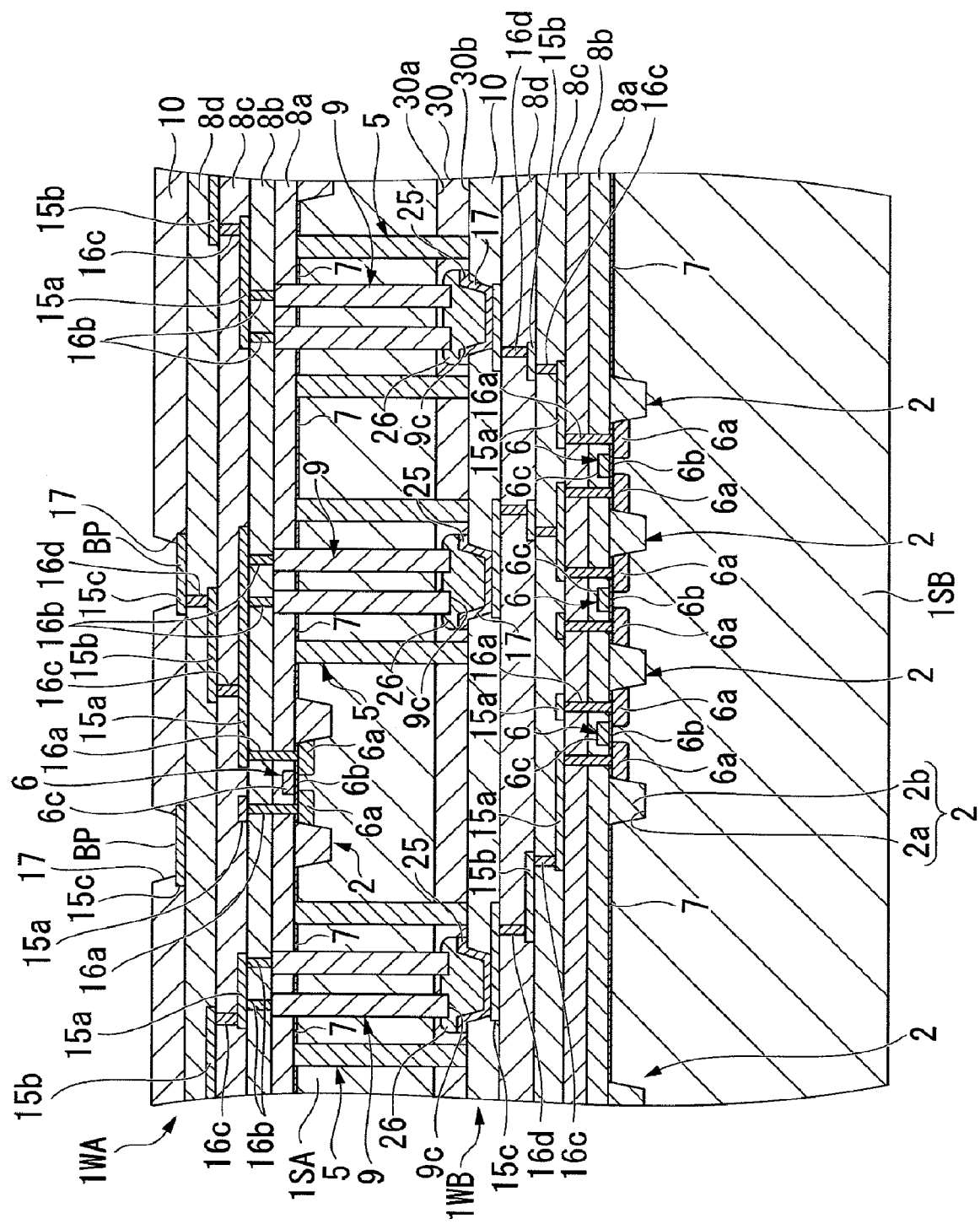
FIG. 3 is a cross-sectional view of main part of a semiconductor device which has a through-hole interconnection structure for a semiconductor wafer according to the embodiment.

FIGS. 1A to 3 illustrate a through-hole interconnection structure for a semiconductor wafer according to the first embodiment. FIGS. 1A to 1D and 2A to 2F illustrate a configuration of an electrical signal connecting section which is a part of the through-hole interconnection structure according to the present embodiment. FIG. 3 is a cross-sectional view of main part of an exemplary semiconductor device including the through-hole interconnection structure according to the present embodiment.

As shown in FIG. 3, the semiconductor device according to the present embodiment includes an upper wafer 1WA and a lower wafer 1WB which are bonded together. An electrical signal connecting section which includes a through-hole interconnecting section 9 is provided on a bonding surface 30a of the upper wafer 1WA (i.e., the semiconductor wafer) which faces the lower wafer 1WB. The through-hole interconnecting section 9 is formed to penetrate a substrate 1SA which is a part of the upper wafer 1WA. The through-hole interconnecting section 9 makes a principal surface (one surface, the upper one in FIG. 3) and an opposite back surface (the other surface, the lower one in FIG. 3) of the wafer 1WA in the thickness direction interconnect to each other. An electrical signal connecting section which includes a bump 26 is provided on a bonding surface 30b of the lower wafer 1WB which faces the upper wafer 1WA. In this semiconductor device, oppositely disposed end 9c of the through-hole interconnecting section 9 of the upper wafer 1WA and the bump 26 of the lower wafer 1WB are electrically connected to each other to form a desired semiconductor circuit. The semiconductor circuit includes a MOS-FET 6 provided on the substrates 1SA and 1SB which are parts of the wafers 1WA and 1WB.

As shown in FIG. 3, an insulating adhesive 30 is placed between the bonding surfaces 30a and 30b of the upper and lower wafers 1WA and 1WB. The adhesive 30 ensures mechanical strength between the upper and lower wafers 1WA and 1WB. In the present embodiment, the adhesive 30 enters the range of the through-hole separating section 5. Since the adhesive 30 has an insulating property, the adhesive 30 never disturbs the performance of the semiconductor circuit.

Reference numeral 5 in the semiconductor device shown in FIG. 3 denotes a through-hole separating section (separating section) which penetrates the substrate 1SA and includes an insulating layer. The through-hole separating section 5 is provided to protrude from the bonding surface 30a. The through-hole separating section 5 surrounds each through-hole interconnecting section 9 which is the electrical signal connecting section.

The through-hole separating section 5 may be of the length of, longer or shorter than, the through-hole interconnecting section 9 surrounded by the through-hole separating section. The distance between the upper and lower wafers 1WA and 1WB may be equal to or longer than the length of the longer one of the through-hole separating section 5 and the through-hole interconnecting section 9.

The through-hole interconnecting section 9 includes a main conductor film and a barrier conductor film. The main conductor film is made of copper, tungsten or other material. The barrier conductor film is made of titanium nitride or other material. The barrier conductor film is thinner than the main conductor film and is made to cover side and bottom surfaces of the main conductor film. The through-hole interconnecting section 9 is electrically connected to a bonding pad BP or the MOS-FET 6 via wires 15a, 15b and 15c.

Referring to FIGS. 1A to 2F, configurations of the through-hole separating section 5 and the through-hole interconnecting section 9 will be described. FIG. 1A is an enlarged longitudinal cross-sectional view showing only a vicinity of the bonding surface 30a of the upper wafer 1WA which is a part of the semiconductor device shown in FIG. 3. FIG. 1B is an enlarged transverse cross-sectional view showing only the through-hole separating section 5 and the through-hole interconnecting section 9 of the wafer 1WA. FIG. 1A is a longitudinal cross-sectional view taken along line C-C in FIG. 1B. FIG. 1B is a transverse (horizontal) cross-sectional view taken along line A-A in FIG. 1A.

As shown in FIG. 1A, the through-hole interconnecting section 9 which is a part of the upper wafer 1WA is a protruded connecting section which includes an end 9c. The end 9c is provided to protrude from the bonding surface 30a where the substrate 1SA is exposed. As shown in FIG. 1B, the through-hole interconnecting section 9 has a square ring cross section in which two or more straight lines extending in different directions are joined at each end (in FIG. 1B, two straight lines extend in a first direction and two straight lines extend in a direction perpendicular to the first direction).

A cross-section of the through-hole separating section 5 has a square ring shape as shown in FIG. 1B. The through-hole separating section 5 is formed as a frame which surrounds the through-hole interconnecting section 9 with a predetermined interval left therebetween. Since the through-hole interconnecting section 9 and the through-hole separating section 5 have ring cross-sections, difference (i.e., variation) in rigidity to withstand the load among directions is significantly small. Thus, the through-hole interconnecting section 9 and the through-hole separating section 5 have sufficient rigidity to withstand the load they receive when the wafers 1WA and 1WB are bonded together.

In the present embodiment, as shown in FIG. 1B, a contour 5R of the cross section of the through-hole separating section 5 is geometrically similar, but larger in size, to a contour 9R of the cross section of the through-hole interconnecting section 9. The contours 5R and 9R are disposed concentrically.

In the present embodiment, as shown in FIGS. 1A and 1B, the through-hole interconnecting section 9 is disposed inside of the through-hole separating section 5 with a predetermined interval left therebetween. The inner surface of the through-hole separating section 5 and the outer surface of the through-hole interconnecting section 9 are disposed in parallel with a constant interval left therebetween.

Although the through-hole interconnecting section 9 and the through-hole separating section 5 have square ring cross-sections in the example shown in FIGS. 1A and 1B, they may alternatively have rectangular or parallelogram ring cross-sections.

The configuration of the cross section of the through-hole interconnecting section 9 is not limited to those shown in FIGS. 1A and 1B and may include a curved line or two or more straight lines extending in different directions. For example, the configuration shown in FIGS. 1C and 1D may be employed.

FIGS. 1C and 1D show another exemplary configuration of the through-hole interconnecting section. FIG. 1C is an enlarged longitudinal cross-sectional view showing only a vicinity of the bonding surface 30a of the upper wafer 1WA which is a part of the semiconductor device shown in FIG. 3. FIG. 1D is an enlarged transverse cross-sectional view showing only the through-hole separating section 5 and the through-hole interconnecting section 91 of the wafer 1WA. FIG. 1C is a longitudinal cross-sectional view taken along line C-C in FIG. 1D. FIG. 1D is a transverse (horizontal) cross-sectional view taken along line A-A in FIG. 1C.

In the example shown in FIGS. 1C and 1D, the through-hole interconnecting section 91 has a circular ring cross-section, which includes a curved line (a circular line in the example shown in FIG. 1D). In the example shown in FIGS. 1C and 1D, as in the example shown in FIGS. 1A and 1B, the through-hole interconnecting section 91 is disposed inside of the through-hole separating section 5 with a predetermined interval left therebetween. A contour 5R of the transverse cross section of the through-hole separating section 5 and a contour 91R of the transverse cross section of the through-hole interconnecting section 91 are disposed concentrically.

In the example shown in FIGS. 1C and 1D, although the through-hole interconnecting section 91 has a circular ring transverse cross section, the cross section may include a curved line like a circular line or an S-shape line.

The transverse cross section of the through-hole interconnecting section 9 may also include plural lines as shown in FIGS. 2A to 2F. In FIGS. 2A to 2F, the upper figures are enlarged longitudinal cross-sectional views each showing a vicinity of the bonding surface 30a of the upper wafer 1WA which is a part of the semiconductor device shown in FIG. 3. The lower figures are enlarged transverse cross-sectional views each showing the through-hole separating section 5 and the through-hole interconnecting section of the wafer 1WA. In FIGS. 2A to 2F, the enlarged longitudinal cross-sectional view are taken along line C-C in a corresponding enlarged transverse cross-sectional view, and the enlarged transverse (horizontal) cross-sectional view is taken along line A-A in a corresponding enlarged longitudinal cross-sectional view.

As shown in FIG. 2A, a through-hole interconnecting section 92 includes two U-shaped arrangements 92a and 92a when seen in an enlarged cross-sectional view. As shown in the enlarged transverse cross-sectional view of FIG. 2A, the two U-shaped arrangements 92a and 92a are disposed symmetrically in both vertical and horizontal directions with open end thereof facing each other. Each of the U-shaped arrangements 92a and 92a includes two straight lines extending in a first direction (the left and right direction in the enlarged transverse cross-sectional view of FIG. 2A), and a straight line extending in a second direction perpendicular to the first direction (the up and down direction in the enlarged transverse cross-sectional view of FIG. 2A). The straight lines extending in the first direction are integrally joined with both ends of the straight line extending in the second direction to form a folded configuration. The through-hole interconnecting section 92 with the folded configuration includes corner portions where the straight lines are joined to each other. With this configuration, the through-hole interconnecting section 92 has more sufficient rigidity to withstand the load it receives when the wafers 1WA and 1WB are bonded together.

The through-hole interconnecting section 92 shown in FIG. 2A is disposed inside of the through-hole separating section 5 with a predetermined interval left therebetween. Outer surfaces of the two U-shaped arrangements 92a and 92a which are parts of the through-hole interconnecting section 92 and an oppositely facing inner surface of the through-hole separating section 5 are disposed in parallel with a predetermined interval left therebetween.

As shown in the enlarged transverse cross-sectional view of FIG. 2B, a through-hole interconnecting section 93 is formed by two L-shaped arrangements 93a and 93a. The L-shaped arrangements 93a and 93a each include a first straight line extending in a first direction (the left and right direction in the enlarged transverse cross-sectional view in FIG. 2B), and a second straight line extending in a direction perpendicular to the first direction (the up and down direction in the enlarged transverse cross-sectional view in FIG. 2B). The first and second straight lines, having the same length, are integrally joined to each other at each end thereof to form a folded configuration. As shown in the enlarged transverse cross-sectional view of FIG. 2B, the two L-shaped arrangements 93a and 93a are disposed symmetrically about a line angled at 45 degrees with respect to the first direction with apexes 93b and 93b facing outside.

As shown in FIG. 2B, the through-hole interconnecting section 93 is disposed inside of the through-hole separating section 5 with a predetermined interval left therebetween. Outer surfaces of the two L-shaped arrangements 93a and 93a which are parts of the through-hole interconnecting section 93 and an oppositely facing inner surface of the through-hole separating section 5 are disposed in parallel.

As shown in the enlarged transverse cross-sectional view of FIG. 2C, a through-hole interconnecting section 94 has a cross-shaped arrangement. The cross-shaped arrangement includes a straight line extending in a first direction (the left and right direction in the enlarged transverse cross-sectional view of FIG. 2C), and a straight line extending in a direction perpendicular to the first direction (the up and down direction in the enlarged transverse cross-sectional view of FIG. 2C). These straight lines are integrally joined at their central portions. As shown in FIG. 2C, the through-hole interconnecting section 94 is disposed inside of the through-hole separating section 5 with a predetermined interval left therebetween. A contour 5R of the cross section of the through-hole separating section 5 and a contour 94R of the cross section of the through-hole interconnecting section 94 are disposed concentrically.

As shown in an enlarged transverse cross-sectional view of FIG. 2D, a through-hole interconnecting section 95 is formed in an H-shaped arrangement. The H-shaped arrangement includes a first straight line extending in a first direction (the left and right direction in the enlarged transverse cross-sectional view of FIG. 2D), and two second straight lines extending in a direction perpendicular to the first direction (the up and down direction in the enlarged transverse cross-sectional view of FIG. 2D). These straight lines are integrally formed with central portions of the second straight lines joined to ends of the first straight line.

As shown in FIG. 2D, the through-hole interconnecting section 95 is also disposed inside of the through-hole separating section 5 with a predetermined interval left therebetween. A contour 5R of the cross section of the through-hole separating section 5 and a contour 95R of the cross section of the through-hole interconnecting section 95 are disposed concentrically. Outer surfaces of the two second lines which are parts of the transverse cross section of the through-hole interconnecting section 95 and an oppositely facing inner surface of the through-hole separating section 5 are disposed in parallel with a constant interval left therebetween.

As shown in an enlarged transverse cross-sectional view of FIG. 2E, a through-hole interconnecting section 96 is formed in an L-shaped arrangement. The L-shaped arrangement includes a first straight line extending in a first direction (the left and right direction in the enlarged transverse cross-sectional view in FIG. 2E), and a second straight line extending in a direction perpendicular to the first direction (the up and down direction if the enlarged transverse cross-sectional view of FIG. 2E). The first and second straight lines are of the same length and are integrally joined at their ends to form a folded configuration.

The through-hole interconnecting section 96 shown in FIG. 2E is also disposed inside of the through-hole separating section 5 with a predetermined interval left therebetween. The first and second straight lines which are parts of the transverse cross section of the through-hole interconnecting section 96 and an inner surface of the through-hole separating section 5 are disposed in parallel.

As shown in an enlarged transverse cross-sectional view of FIG. 2F, a through-hole interconnecting section 97 is formed in a U-shaped arrangement. The U-shaped arrangement includes two straight lines extending in a first direction (the left and right direction in the enlarged transverse cross-sectional view of FIG. 2F) and a straight line extending in a second direction perpendicular to the first direction (the up and down direction ion the enlarged transverse cross-sectional view of FIG. 2F). The straight lines extending in the first direction are integrally joined to the both ends of the straight line extending in the second direction to form a folded configuration.

The through-hole interconnecting section 97 shown in FIG. 2F is also disposed inside of the through-hole separating sections 5 with a predetermined interval left therebetween. The straight lines extending in the first and second directions which are parts of the transverse cross section of the through-hole interconnecting section 97 and the inner surface of the through-hole separating section 5 are disposed in parallel with constant intervals left between each straight line and the inner surface of the through-hole separating section 5.

In the semiconductor device shown in FIG. 3, the upper wafer 1WA includes a thin plate shaped as a substantial circle when seen in a plan view. The substrate 1SA which is a part of the upper wafer 1WA is made of n-type or p-type single crystal of silicon (Si) or other material. As shown in FIG. 3, a groove-shaped separating section 2 for separating devices is formed on the principal surface of the substrate 1SA (i.e., on the principal surface of the wafer 1WA). The groove-shaped separating section 2 includes a buried insulating layer 2b of silicon oxide ($SiO_2$) or other material. An active region is defined on the principal surface of the substrate 1SA by the separating section 2.

A device like a metal oxide semiconductor field effect transistor (MOS-FET) 6 which is a part of a semiconductor circuit is formed in the active region surrounded by the groove-shaped separating section 2. The MOS-FET 6 includes a semiconductor region 6a for source and drain, a gate insulation film 6b and a gate electrode 6c. The semiconductor region 6a for source and drain is provided by doping the substrate 1SA with desired impurity (e.g., phosphorus (P) or arsenic (As) for n-type channel MOS-FET 6, and boron (B) for p-type channel MOS-FET 6). The gate insulation film 6b includes silicon oxide or other material and is provided on the principal surface of the substrate 1SA. The gate electrode 6c includes low-resistance polysilicon or other material and is provided on the gate insulation film 6b. The insulating layer 7 in the active region on the principal surface of the substrate 1SA includes an insulating layer of silicon oxide or other material.

Other active devices such as a bipolar transistor and a diode may be provided instead of the MOS-FET 6 shown in FIG. 3. Passive devices such as resistance (e.g., diffusion resistance and polysilicon resistance), a capacitor and an inductor may be provided instead of the MOS-FET 6.

In FIG. 3, reference numerals 8a, 8b, 8c and 8d each denote an interlayer insulation film, numeral 10 denotes a surface protecting film, numerals 15a, 15b, and 15c denote wiring and numerals 16a, 16b, 16c and 16d each denote a plug. The interlayer insulation films 8a, 8b, 8c, and 8d are made of silicon oxide or other material. The wiring 15a to 15c and the plugs 16a to 16d are made of metal such as tungsten (W), aluminum (Al), copper (Cu). The wiring 15a of a first layer is electrically connected to the semiconductor region 6a for source and drain and the gate electrode 6c of the MOS-FET 6 via the plug 16a, and to the through-hole interconnecting section 9 via the plug 16b. The surface protecting film 10 includes, for example, a single silicon oxide film or a lamination of a silicon oxide film and a silicon nitride film deposited on the silicon oxide film. An opening 17 is formed in a part of the surface protecting film 10 through which a part of the third wiring 15c is exposed. The part of the wiring 15c exposed through the opening 17 when seen in a plan view is formed as a bonding pad BP. Although not shown in FIG. 3, a bump may be provided in connection with the bonding pad BP on the principal surface of the wafer 1WA.

In the semiconductor device shown in FIG. 3, the structure of the lower wafer 1WB is almost the same as that of the upper wafer 1WA except for the following points. The through-hole separating section 5 and the through-hole interconnecting section 9 are not formed on the lower wafer 1WB. A conductive pattern 25 underlying the bump electrically connected to the bonding pad BP through the opening 17 is formed on the opening 17 formed on the principal surface of the lower wafer 1WB. A bump 26 is formed on the conductive pattern 25 underlying the bump. The bump 26 is provided to protrude from the bonding surface 30b of the lower wafer 1WB. The bump 26 includes a conductive material such as copper, and as shown in FIG. 3, is electrically connected to an uppermost wiring layer 15c of the lower wafer 1WB.

The through-hole interconnection structure of the upper wafer 1WA according to the present embodiment is used for a semiconductor wafer which includes wafers 1WA and 1WB each including substrates 1SA and 1SB on which a MOS-FET 6 is provided. In the present embodiment, the through-hole interconnecting section 9 electrically connected to another wafer 1WB protrudes from the bonding surface 30a which is to be bonded with another wafer 1WB. The transverse cross section of the through-hole interconnecting section 9 includes two or more straight lines extending in different directions. With this configuration, the through-hole interconnecting section 9 has sufficient rigidity to withstand the load it receives when the wafers 1WA and 1WB are bonded together. Thus, the through-hole interconnecting section 9 is less easily damaged even if subjected to the load when the wafers 1WA and 1WB are bonded together.

In the through-hole interconnection structure of the present embodiment, since the through-hole separating section 5 which surrounds the through-hole interconnecting section 9 is provided on and protrudes from the bonding surface 30a, the through-hole interconnecting section 9 can be reinforced by the through-hole separating section 5. In this manner, damages to the through-hole interconnecting section 9 due to bonding process of the wafers 1WA and 1WB can be prevented more effectively.

In the through-hole interconnection structure according to the present embodiment, the through-hole interconnecting section 9 can be more effectively reinforced by the through-hole separating section 5 with the contour of the cross section of the through-hole separating section 5 being the same as that of the through-hole interconnecting section 9.

Figure 4:
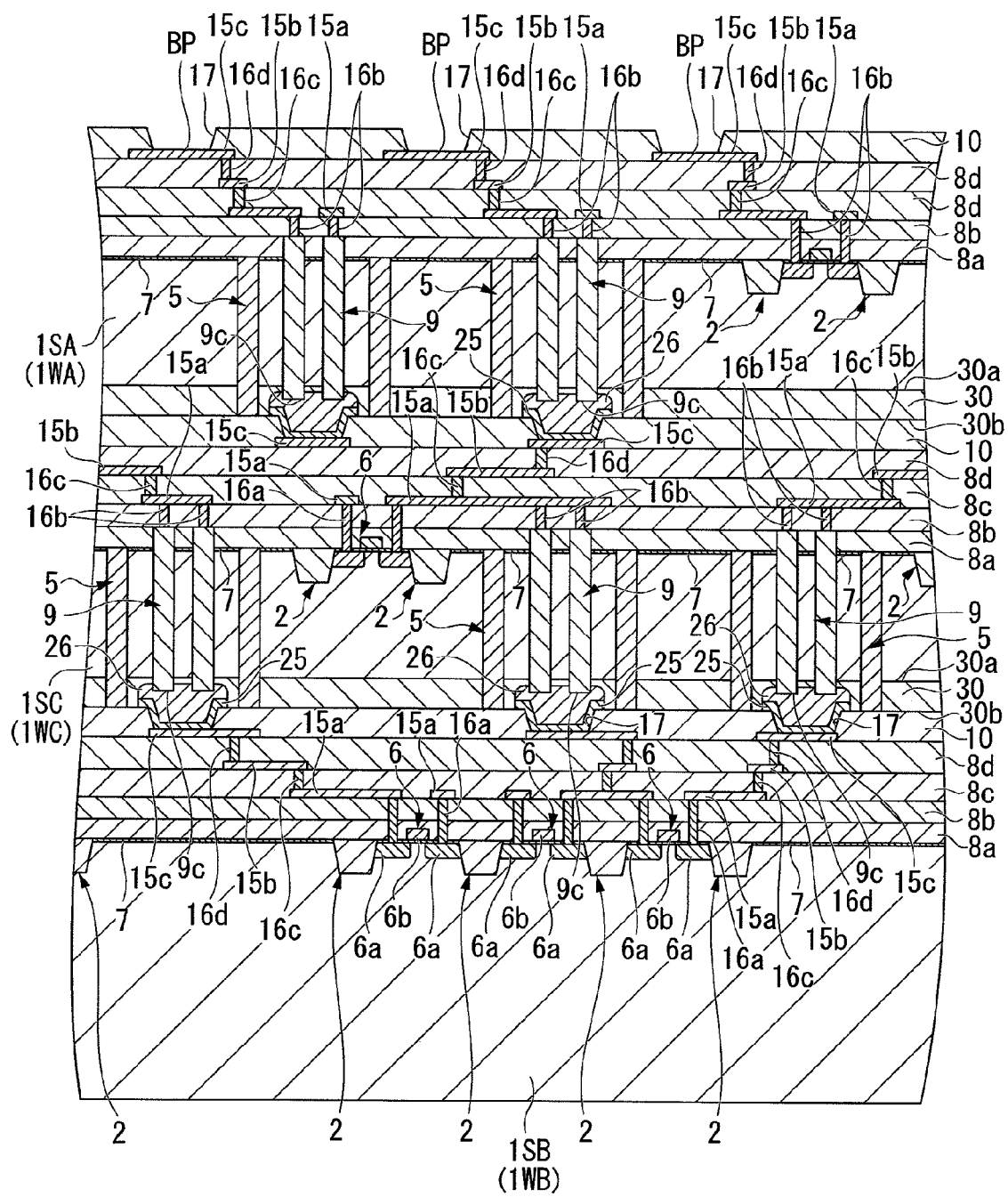
FIG. 4 is a cross-sectional view of main part of another exemplary semiconductor device.

However, the present invention is not limited only to the aforementioned examples. For example, although the example shown in FIG. 3 relates to the semiconductor device with two wafers 1WA and 1WB bonded together, the number of the wafers to be bonded is not limited to two, and three or more wafers may be bonded. FIG. 4 is a cross-sectional view of main part of another exemplary semiconductor device which includes a through-hole interconnection structure according to the invention. The semiconductor device shown in FIG. 4 is a three-dimensional multi-layered semiconductor device in which three substrates 1SA, 1SB and 1SC are stacked. In the semiconductor device shown in FIG. 4, the same members as those shown in FIG. 3 are denoted by the same reference numerals and description thereof will be omitted.

The semiconductor device shown in FIG. 4 includes a through-hole interconnecting section 9 with sufficient rigidity to withstand the load it receives when the wafers 1WA and 1WC are bonded together. Thus, the through-hole interconnecting section 9 is less easily damaged when the wafers 1WA, 1WC and 1WB are bonded together. With this configuration, the semiconductor device is excellent in reliability and stability of performance.

Second Embodiment

Figure 22:
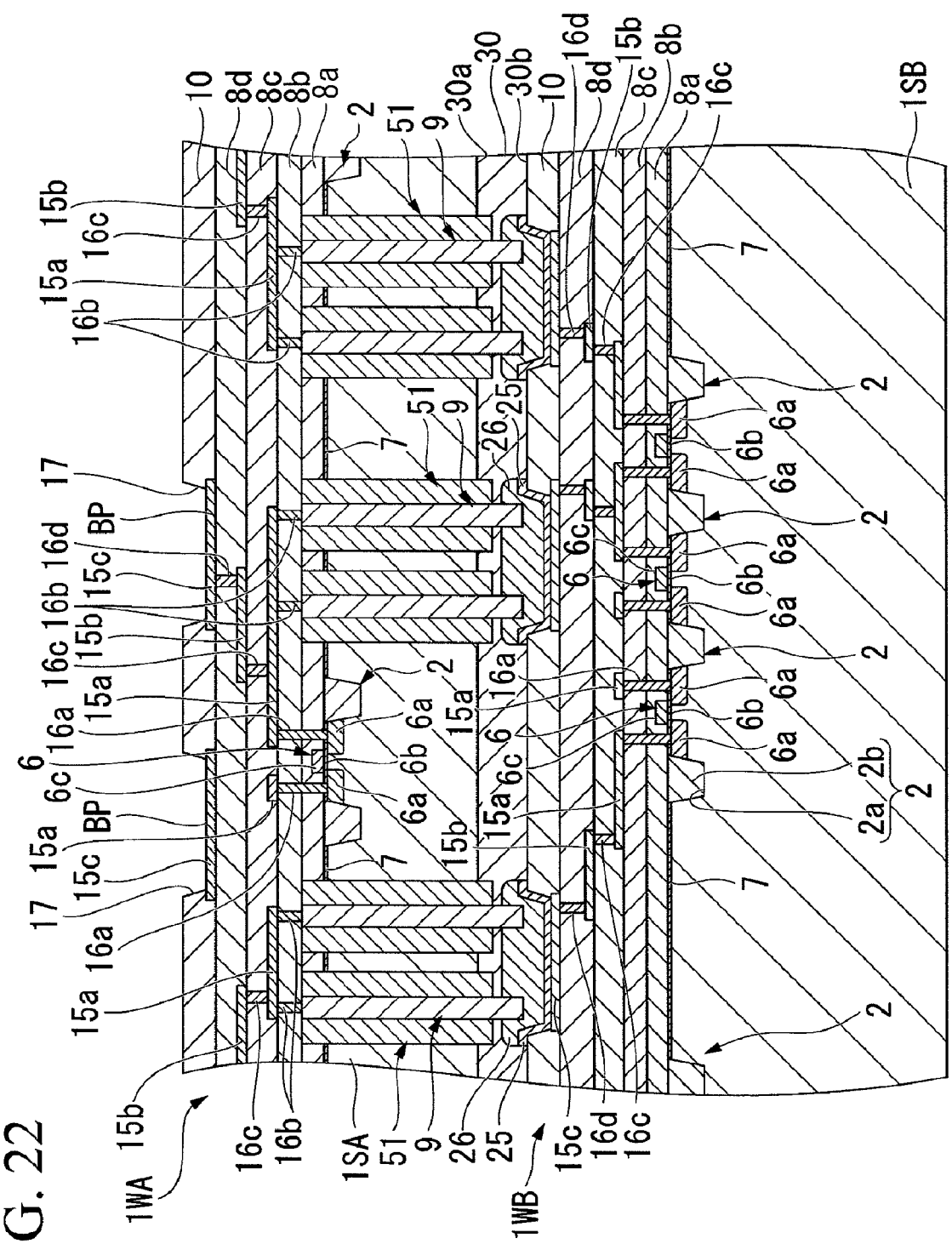
FIG. 22 is a cross-sectional view of main part of another exemplary semiconductor device including a through-hole interconnection structure of a semiconductor wafer according to an embodiment of the invention.
Figure 23:
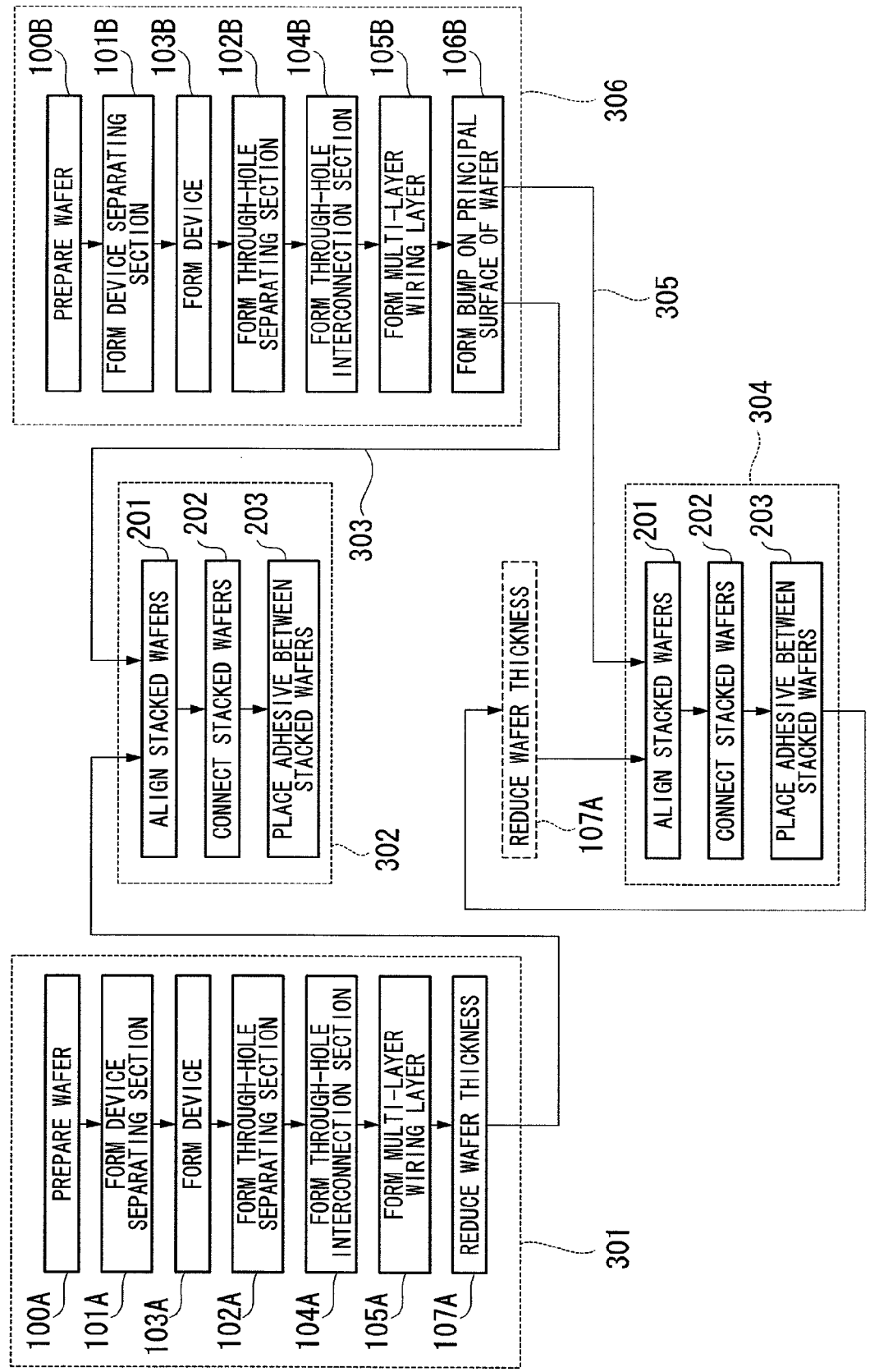
FIG. 23 is a flowchart showing a manufacturing process of the semiconductor device.

FIGS. 5A to 23 illustrate another exemplary through-hole interconnection structure of a semiconductor wafer according to the invention. FIGS. 5A to 6F each illustrate a configuration of an electrical signal connecting section which is a part of the through-hole interconnection structure according to the invention. FIG. 22 is a cross-sectional view of main part of an exemplary semiconductor device which includes a through-hole interconnection structure according to the invention. FIGS. 7 to 21 illustrate a manufacturing process of the semiconductor device shown in FIG. 22. FIG. 23 is a flowchart illustrating the manufacturing process of the semiconductor device shown in FIG. 22. In FIG. 23, reference numeral 301 denotes a manufacturing process of an upper wafer of a first layer, numeral 302 denotes a bonding process of upper and lower wafers of first and second layers, numeral 303 denotes a lower wafer of the second layer, numeral 304 denotes a bonding process of the upper and lower wafers after the third layer, numeral 305 denotes a lower wafer above the third layer, and numeral 306 denotes a manufacturing process of the lower wafer above the second layer.

In the semiconductor device according to the present embodiment shown in FIGS. 5A to 23, the same members as those shown in FIG. 3 are denoted by the same reference numerals and description thereof will be omitted.

The semiconductor device according to the present embodiment shown in FIG. 22 differs from that shown in FIG. 3 in a configuration of a through-hole separating section 51 (i.e., the separating section) provided in an upper wafer 1WA (i.e., the semiconductor wafer). The semiconductor device according to the present embodiment shown in FIG. 22 also differs from the semiconductor device shown in FIG. 3 in that the through-hole separating section 51 (i.e., the separating section) and a through-hole interconnecting section 9 are integrally formed.

As shown in FIG. 22, the through-hole separating section 51 is provided to protrude from a bonding surface 30a. The through-hole separating section 51 is in contact with the peripheral surface of each through-hole interconnecting section 9. The through-hole separating section 51 surrounds and covers each through-hole interconnecting section 9. The protrusion length of the through-hole separating section 51 from the bonding surface 30a is shorter than that of the through-hole interconnecting section 9. An end 9c and a side surface near the end 9c of the through-hole interconnecting section 9 are not covered by the through-hole separating section 51, but are connected to a bump 26 of the lower wafer 1WB.

Figure 5A:
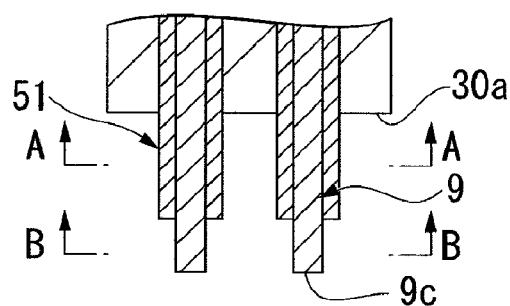
FIG. 5A is an enlarged longitudinal cross-sectional view showing the vicinity of a bonding surface of an upper wafer 1WA which is a part of a semiconductor device shown in FIG. 22.

Referring now to FIGS. 5A to 6F, configurations of the through-hole separating section 51 and the through-hole interconnecting section 9 will be described. FIG. 5A is an enlarged longitudinal cross-sectional view showing a vicinity of the bonding surface 30a of the upper wafer 1WA which is apart of the semiconductor device shown in FIG. 22. FIG. 5B is an enlarged transverse cross-sectional view showing the through-hole interconnecting section 9 of the wafer 1WA. FIG. 5C is an enlarged transverse cross-sectional view showing only the through-hole separating section 51 and the through-hole interconnecting section 9 of the wafer 1WA. The enlarged longitudinal cross-sectional view of FIG. 5A relates to the line D-D in FIG. 5B and the line C-C in FIG. 5C. The enlarged transverse (horizontal) cross-sectional view of FIG. 5B is taken along line B-B in FIG. 5A. The enlarged transverse (horizontal) cross-sectional view of FIG. 5C is taken along line A-A in FIG. 5A. The through-hole interconnecting section 9 shown in FIGS. 5A to 5C is the same as that shown in FIGS. 1A and 1B.

Figure 5B:
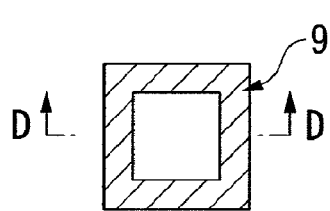
FIG. 5B is an enlarged transverse cross-sectional view showing a through-hole interconnecting section of the upper wafer 1WA.
Figure 5C:
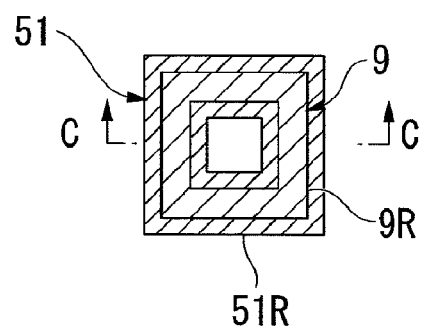
FIG. 5C is an enlarged transverse cross-sectional view showing a through-hole separating section and the through-hole interconnecting section of the upper wafer 1WA.

As shown in FIGS. 5A and 5C, the through-hole separating section 51 has a transverse cross section with different-sized double-square rings. The through-hole separating section 51 is in contact with a peripheral surface of the through-hole interconnecting section 9 so as to cover the inner and outer sides of the through-hole interconnecting section 9. As shown in FIG. 5C, a contour 5R of the cross section of the through-hole separating section 51 is similar to a contour 9R of the cross section of the through-hole interconnecting section 9. The contour 51R of the cross section of the through-hole separating section 5 and the contour 9R of the cross section of the through-hole interconnecting section 9 are disposed concentrically.

In the example shown in FIGS. 5A to 5C, the through-hole separating section 51 has a square ring cross section as in the through-hole interconnecting section 9. However, the configuration of the through-hole separating section integrally formed with the through-hole interconnecting section can be suitably changed according to the configuration of the through-hole interconnecting section. For example, while the through-hole interconnecting section may have a rectangular or parallelogram cross section, the through-hole separating section may have a cross section similar to that of the through-hole interconnecting section. If the through-hole separating section and the through-hole interconnecting section are integrally formed, in order to manufacture efficiently, it is preferred that both of them have similar cross section. However, the cross section may be different from each other.

Figure 5D:
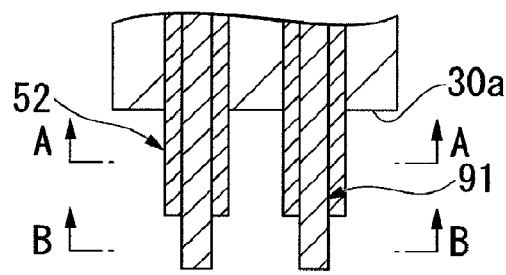
FIG. 5D is a cross-sectional view similar to FIG. 5A showing another exemplary configuration of a through-hole interconnecting section 91 and a through-hole separating section 52.
Figure 5E:
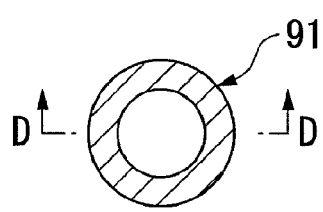
FIG. 5E is a cross-sectional view similar to FIG. 5B showing the same example as FIG. 5D.
Figure 5F:
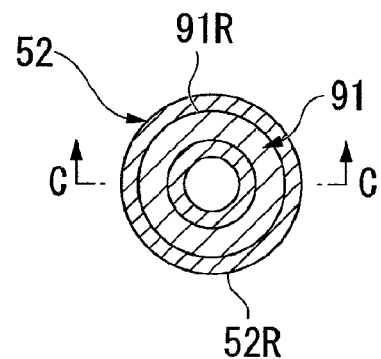
FIG. 5F is a cross-sectional view similar to FIG. 5C showing the same example as FIG. 5D.
Figure 6A:
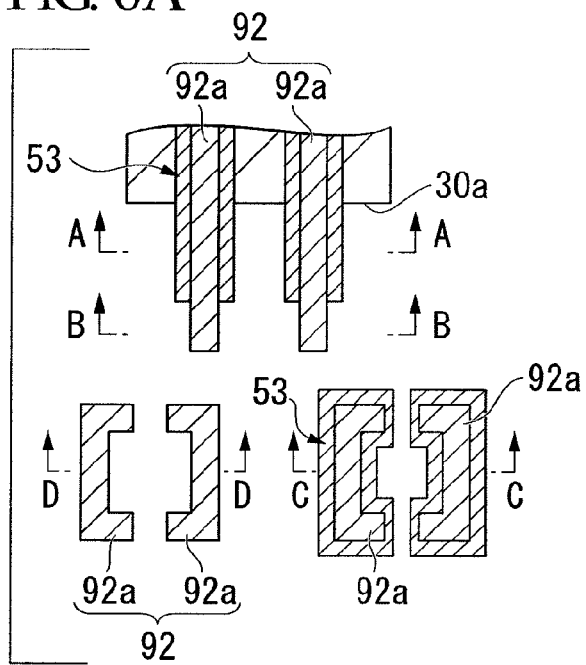
FIG. 6A is a cross-sectional view showing another exemplary configuration of the through-hole separating section.
Figure 6B:
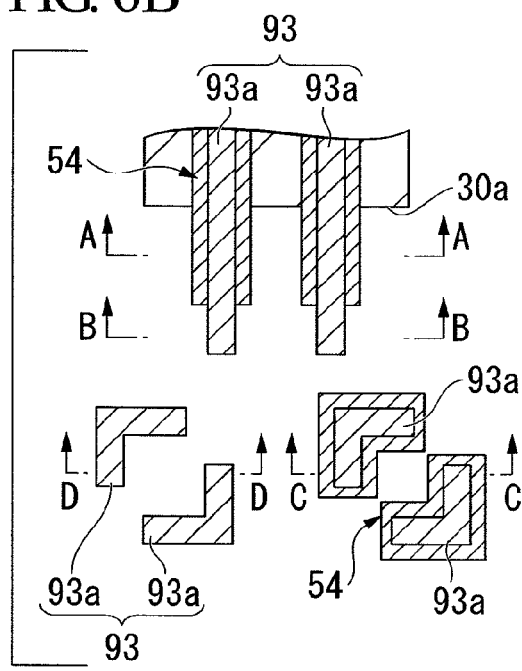
FIG. 6B is a cross-sectional view showing a further exemplary configuration of the through-hole separating section.
Figure 6C:
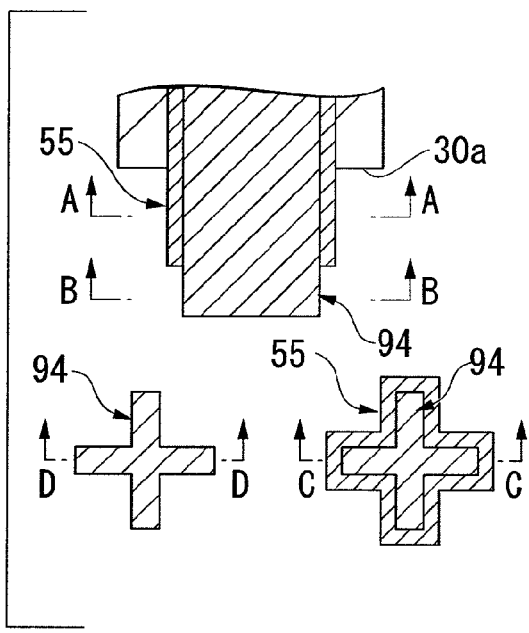
FIG. 6C is a cross-sectional view showing a further exemplary configuration of the through-hole separating section.
Figure 6D:
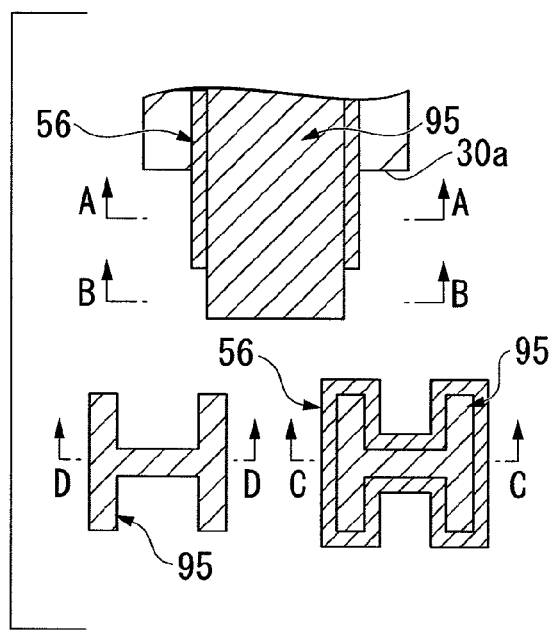
FIG. 6D is a cross-sectional view showing a further exemplary configuration of the through-hole separating section.
Figure 6E:
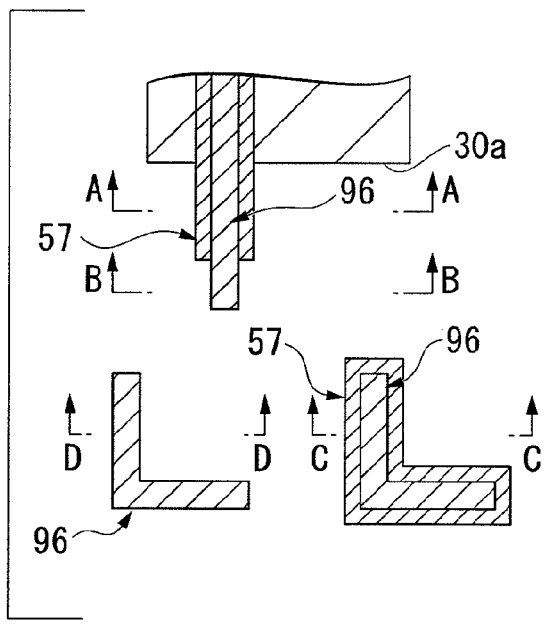
FIG. 6E is a cross-sectional view showing a further exemplary configuration of the through-hole separating section.
Figure 6F:
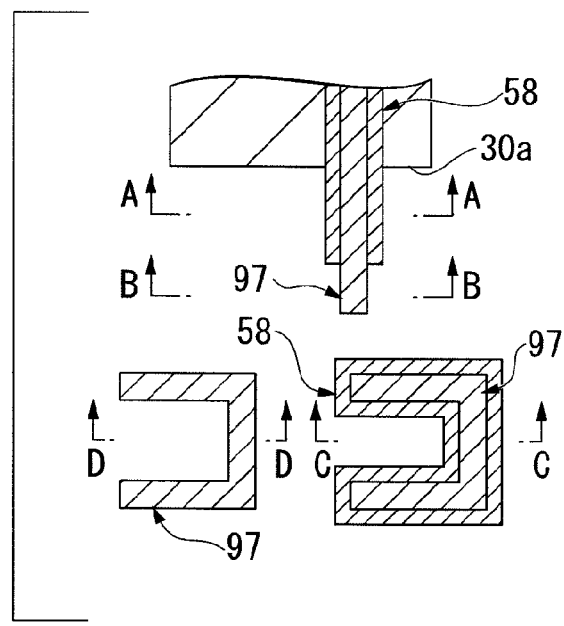
FIG. 6F is a cross-sectional view showing a further exemplary configuration of the through-hole separating section.

The cross section of the through-hole interconnecting section 9 and the through-hole separating section 51 may be configured as shown in FIGS. 5D to 5F.

FIGS. 5D to 5F illustrate another example of the configuration of the through-hole interconnecting section 91 and the through-hole separating section 52. FIG. 5D is an enlarged longitudinal cross-sectional view showing a vicinity of the bonding surface 30a of the upper wafer 1WA which is a part of the semiconductor device shown in FIG. 22. FIG. 5E is an enlarged transverse cross-sectional view showing the through-hole interconnecting section 91 of the wafer 1WA. FIG. 5F is an enlarged transverse cross-sectional view showing the through-hole separating section 52 and the through-hole interconnecting section 91 of the wafer 1WA. The enlarged longitudinal cross-sectional view in FIG. 5D is a cross-sectional view taken along line D-D in FIG. 5E and line C-C in FIG. 5F. The enlarged transverse (horizontal) cross-sectional view shown in FIG. 5E is taken along line B-B in FIG. 5D. An enlarged transverse (horizontal) cross-sectional view shown in FIG. 5F is taken along line A-A in FIG. 5D. The through-hole interconnecting section 91 shown in FIGS. 5D to 5F is the same as that shown in FIGS. 1C and 1D.

As shown in FIGS. 5D and 5F, the through-hole separating section 52 has a transverse cross section with different-sized double-circle rings. The through-hole separating section 52 is in contact with a peripheral surface of the through-hole interconnecting section 9 so as to cover the inner and outer sides of the through-hole interconnecting section 9. As shown in FIG. 5F, a contour 52R of the transverse cross section of the through-hole separating section 52 is similar to a contour 91R of the transverse cross section of the through-hole interconnecting section 91. The contour 52R of the transverse cross section of the through-hole separating section 52 and the contour 91R of the transverse cross section of the through-hole interconnecting section 91 are disposed concentrically.

In the example shown in FIGS. 5D and 5F, although the through-hole interconnecting section 91 and the through-hole separating section 52 have the circular ring transverse cross sections, the cross section may include a curved line like a circular line or an S-shape line. The through-hole separating section formed integral with the through-hole interconnecting section may also have a transverse cross section including a curved line like a circular line or an S-shape similar to those of the through-hole interconnecting section.

The transverse cross section of the through-hole separating section may also include configurations as shown in FIGS. 6A to 6F.

In FIGS. 6A to 6F, the upper figures are enlarged longitudinal cross-sectional views each showing only a vicinity of the bonding surface 30a of the upper wafer 1WA which is a part of the semiconductor device shown in FIG. 22. Figures in the lower left are enlarged transverse cross-sectional views each showing only the through-hole interconnecting section of the wafer 1WA. Figures in the lower right are enlarged transverse cross-sectional views each showing only the through-hole separating section and the through-hole interconnecting section of the wafer 1WA. In FIGS. 6A to 6F, the longitudinal cross-sectional views are taken along line D-D and line C-C in the transverse cross-sectional views. The transverse (horizontal) cross-sectional views on the left are taken along line B-B in the longitudinal cross-sectional views, and the transverse (horizontal) cross-sectional views on the right are taken along line A-A in the longitudinal cross-sectional views.

Through-hole interconnecting sections 92, 93, 94, 95, 96 and 97 shown in FIGS. 6A to 6F are the same as those shown in FIGS. 2A to 2F.

Through-hole separating sections 53, 54, 55, 56, 57 and 58 shown in FIGS. 6A to 6F surround and cover peripheral surfaces of the through-hole interconnecting sections 92, 93, 94, 95, 96 and 97. The through-hole separating sections 53, 54, 55, 56, 57 and 58 and the through-hole interconnecting sections 92, 93, 94, 95, 96, and 97 are integrally formed. Contours of the transverse cross section of the through-hole separating sections 53, 54, 55, 56, 57 and 58 and contours of the cross section of the through-hole interconnecting sections 92, 93, 94, 95, 96 and 97 are similar to each other.

Next, referring to FIGS. 7 to 21 and 23, a manufacturing process of the semiconductor device shown in FIG. 22 will be described.

First, a manufacturing process of the upper wafer will be described. Reference numeral 301 in FIG. 23 denotes the manufacturing process of the upper wafer of the first layer. The upper wafer 1WA is first prepared (process 100A in FIG. 23), and as shown in FIG. 7, the groove-shaped separating section 2 for device separation is formed on the principal surface (i.e., the principal surface of the wafer 1WA) of the substrate 1SA (process 101A in FIG. 23).

Figure 7:
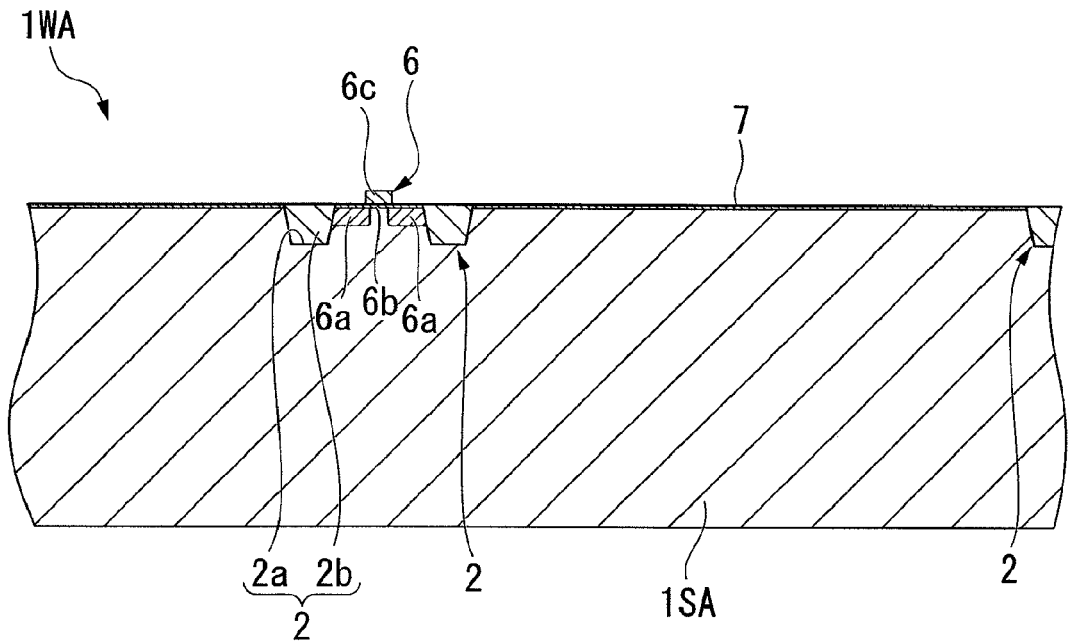
FIG. 7 is a cross-sectional view of main part of an upper wafer in process of manufacture.

Next, in the present embodiment, as shown in FIG. 7, a device like the MOS-FET 6 which includes a semiconductor region 6a for source and drain, a gate insulation film 6b and a gate electrode 6c is formed in the active region surrounded by the groove-shaped separating section 2 of the substrate 1SA (process 103A in FIG. 23). Next, the insulating layer 7 of silicon oxide or other material is provided on the principal surface of the active region of the substrate 1SA.

Figure 8:
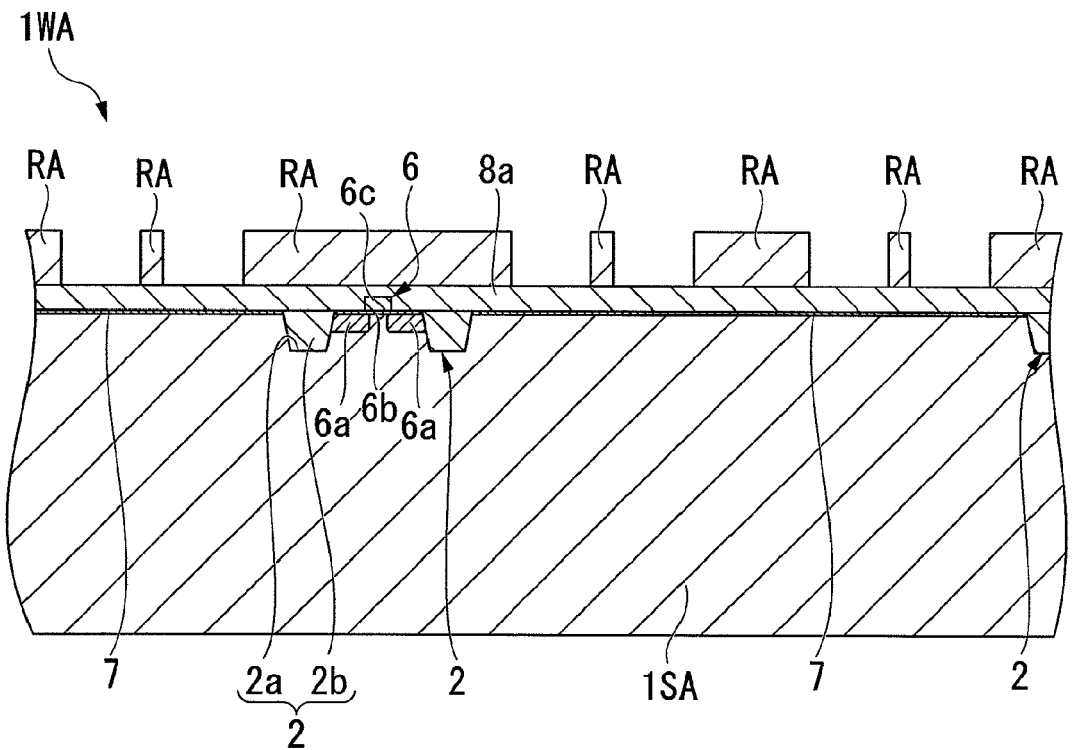
FIG. 8 is a cross-sectional view of main part of the wafer, showing a manufacturing process following the process of FIG. 7.

Then, an insulating layer of silicon oxide or other material is deposited on the principal surface of the substrate 1SA by a chemical vapor deposition (CVD) or other process, and the upper surface of the insulating layer is smoothed to provide an interlayer insulation film 8a as shown in FIG. 8.

Next, the through-hole separating section 51 is formed on the substrate 1SA. First, as shown in FIG. 8, a resist film is applied on the principal surface of the substrate 1SA by spin coating or other process and then exposed and developed to form a resist pattern RA on the principal surface of the substrate 1SA.

Figure 9:
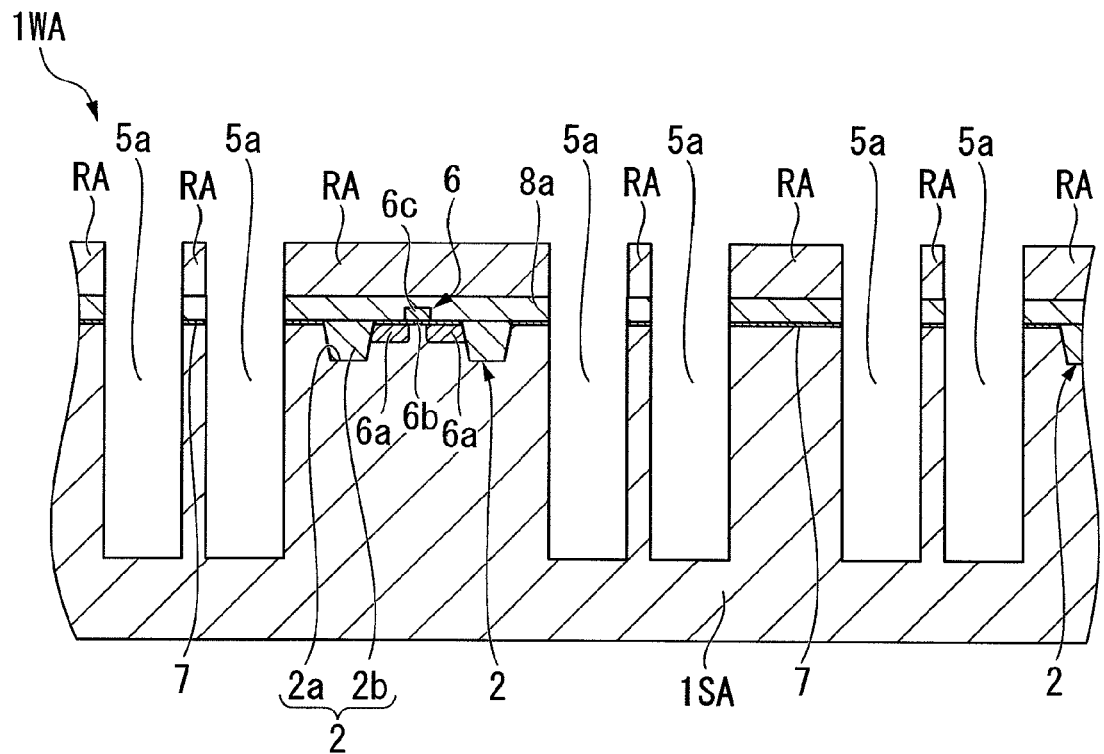
FIG. 9 is a cross-sectional view of main part of the wafer, showing a manufacturing process following the process of FIG. 8.

Deep separation grooves 5a are then formed on the substrate 1SA as shown in FIG. 9 by etching, using the resist pattern RA as an etching mask, portions of the interlayer insulation film 8a, the insulating layer 7 and the substrate 1SA exposed from the resist pattern RA. As shown in FIG. 9, the deep separation groove 5a extends from the principal surface of the substrate 1SA along a direction perpendicular to the principal surface. The deep separation groove 5a ends at a position deeper than the separation groove 2a for device separation.

Figure 10:
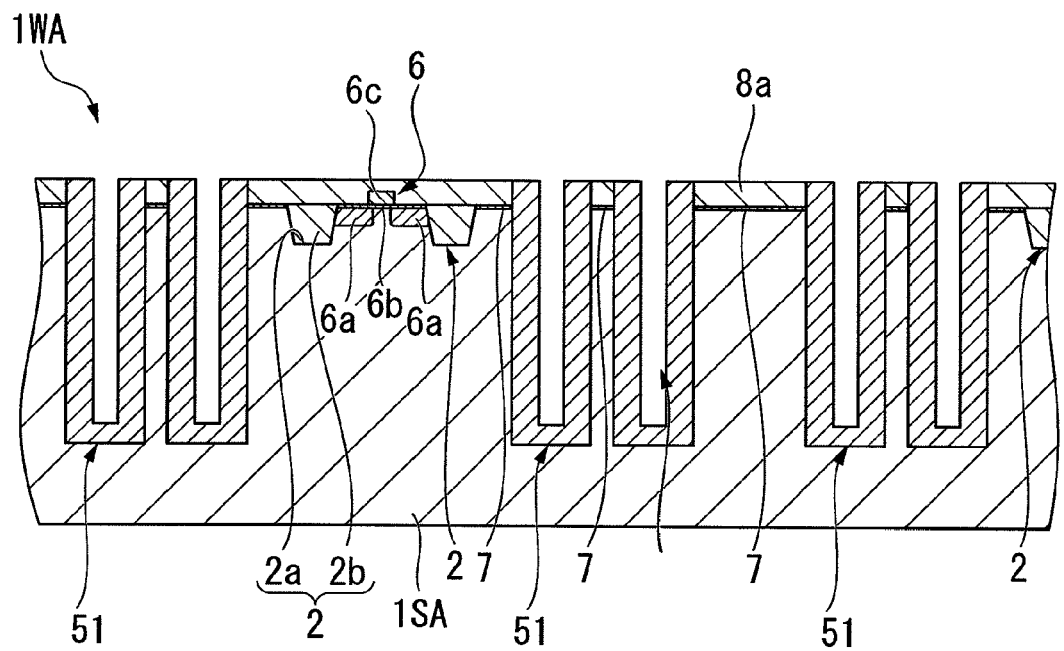
FIG. 10 is a cross-sectional view of main part of the wafer, taken along line A-A in FIG. 11.
Figure 11:
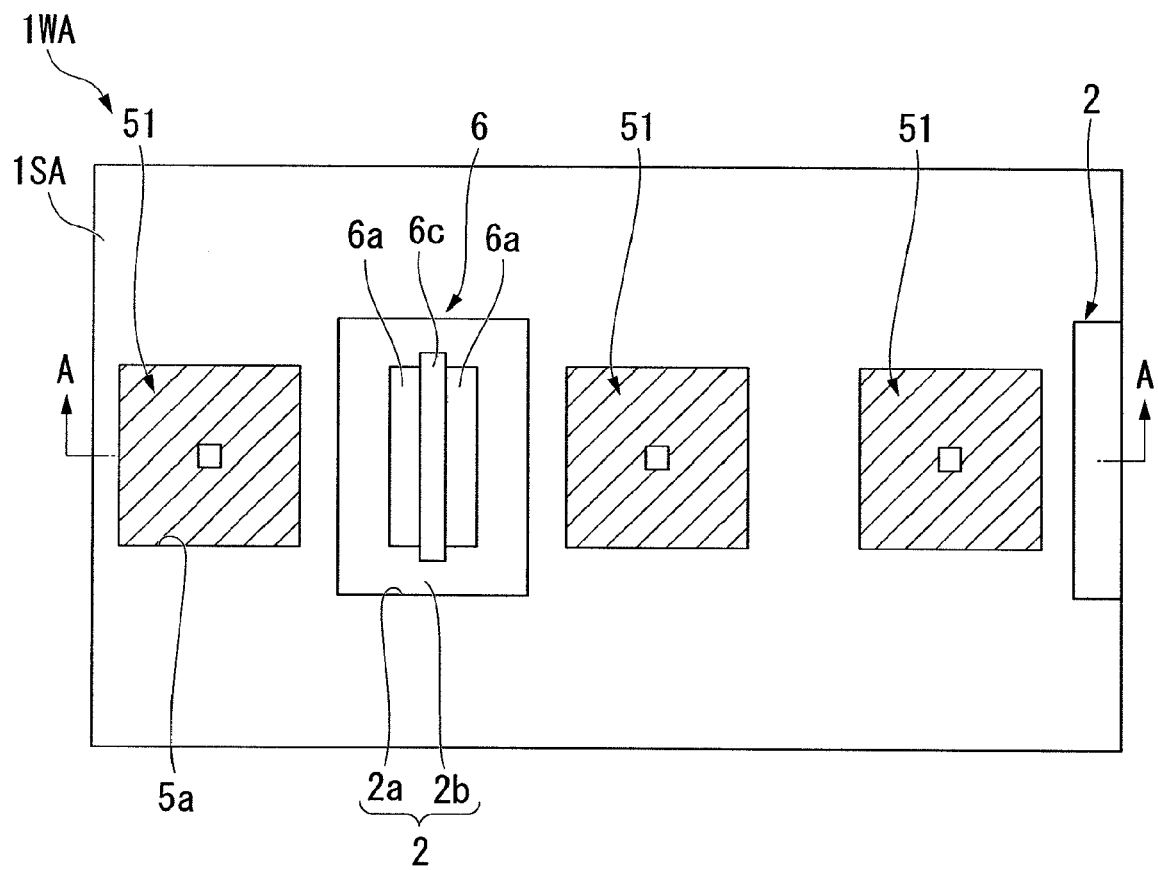
FIG. 11 is a cross-sectional view of main part of the wafer, showing a manufacturing process following the process of FIG. 9.

The resist pattern RA is removed and the insulating layer is formed on an inner surface and a bottom surface of the separation groove 5a. For example, an insulating layer of silicon oxide ($SiO_2$) or other material is deposited by a chemical vapor deposition (CVD) or other process to form the through-hole separating section 51 (process 102A in FIG. 23) as shown in FIGS. 10 and 11. The insulating layer which is a part of the through-hole separating section 51 is formed in the inner surface and the bottom surface of the deep separation groove 5a as shown in FIG. 10. Space exists at a width direction central portion of the deep separation groove 5a to be surrounded by the through-hole separating section 51. FIG. 10 is a cross-sectional view taken along line A-A in FIG. 11. Although FIG. 11 is a plan view, the through-hole separating section 51 is shown with diagonal lines to facilitate visualization.

Next, the through-hole interconnecting section 9 will be formed. First, the barrier conductor film is deposited on the principal surface of the substrate 1SA by a sputtering or other process so as to cover an inner surface and a bottom surface of the deep separation groove 5a surrounded by the through-hole separating section 51. Subsequently, the main conductor film is deposited by the CVD process to fill the space defined by the through-hole separating section 51. Thickness of the main conductor film is larger than that of the barrier conductor film. Then, excess portions of the main conductor film and the barrier conductor film formed outside of the deep separation groove 5a are removed by a chemical mechanical polishing (CMP) or other process so that the main conductor film and the barrier conductor film only exist within the deep separation groove 5a. In this manner, a conductive section used as the through-hole interconnecting section 9 is formed as shown in FIGS. 12 and 13 (process 104A in FIG. 23).

The method of forming the main conductor film is not limited to the CVD and may include plating or other processes.

Figure 12:
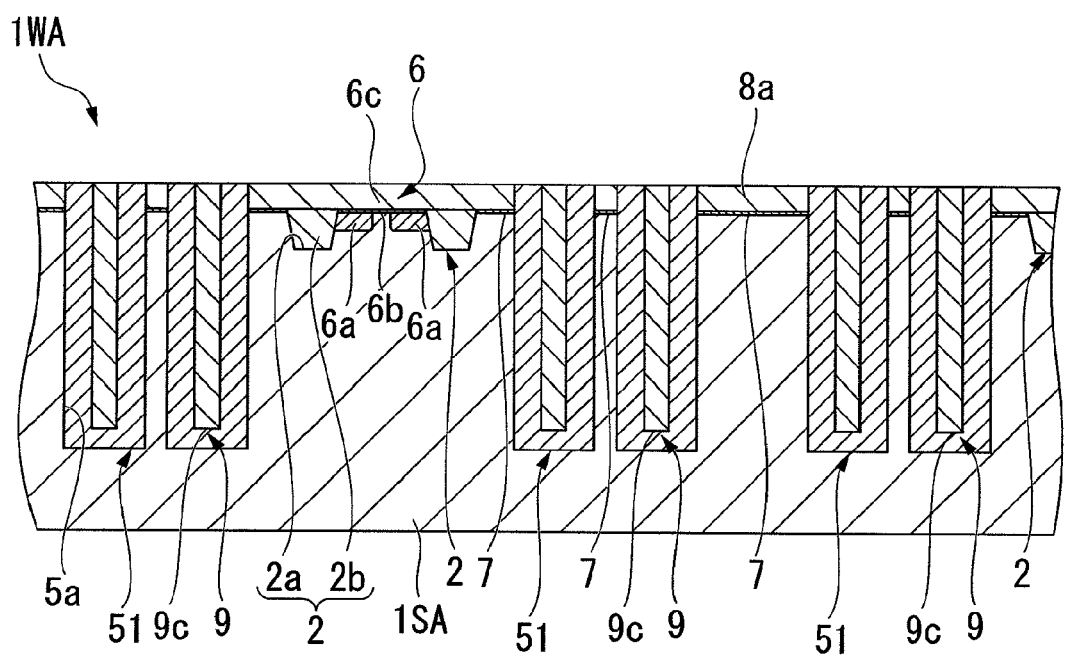
FIG. 12 is a cross-sectional view taken along line A-A in FIG. 13.
Figure 13:
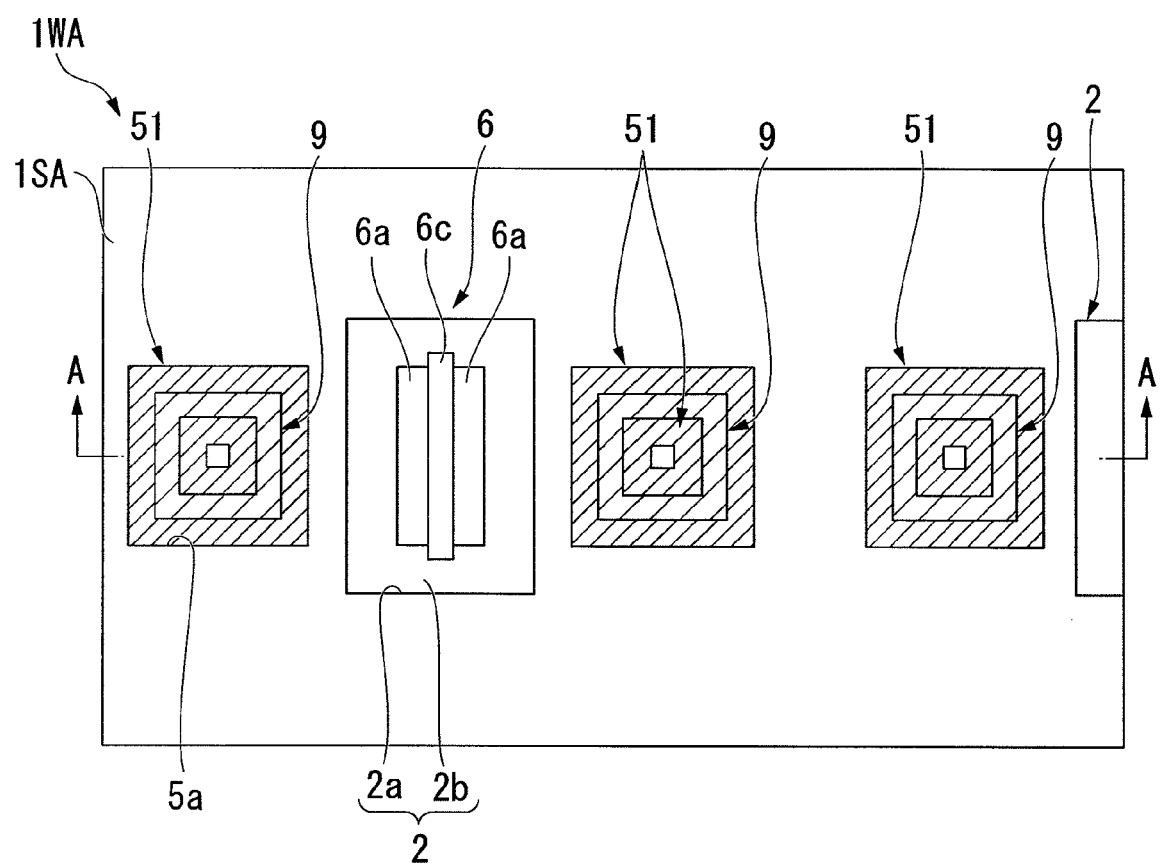
FIG. 13 is a cross-sectional view of main part of the wafer, showing a manufacturing process following the process of FIG. 11.

FIG. 12 is a cross-sectional view taken along line A-A in FIG. 13. Although FIG. 13 is a plan view, the through-hole separating section 51 and the through-hole interconnecting section 9 are shown with diagonal lines to facilitate visualization. As shown in FIGS. 13, 5B and 5C, the through-hole interconnecting section 9 is formed in, for example, a square ring shape when seen as a plane view. The through-hole separating section 51 surrounds and covers the through-hole interconnecting section 9. The through-hole separating section 51 and the through-hole interconnecting section 9 are integrally formed.

Figure 14:
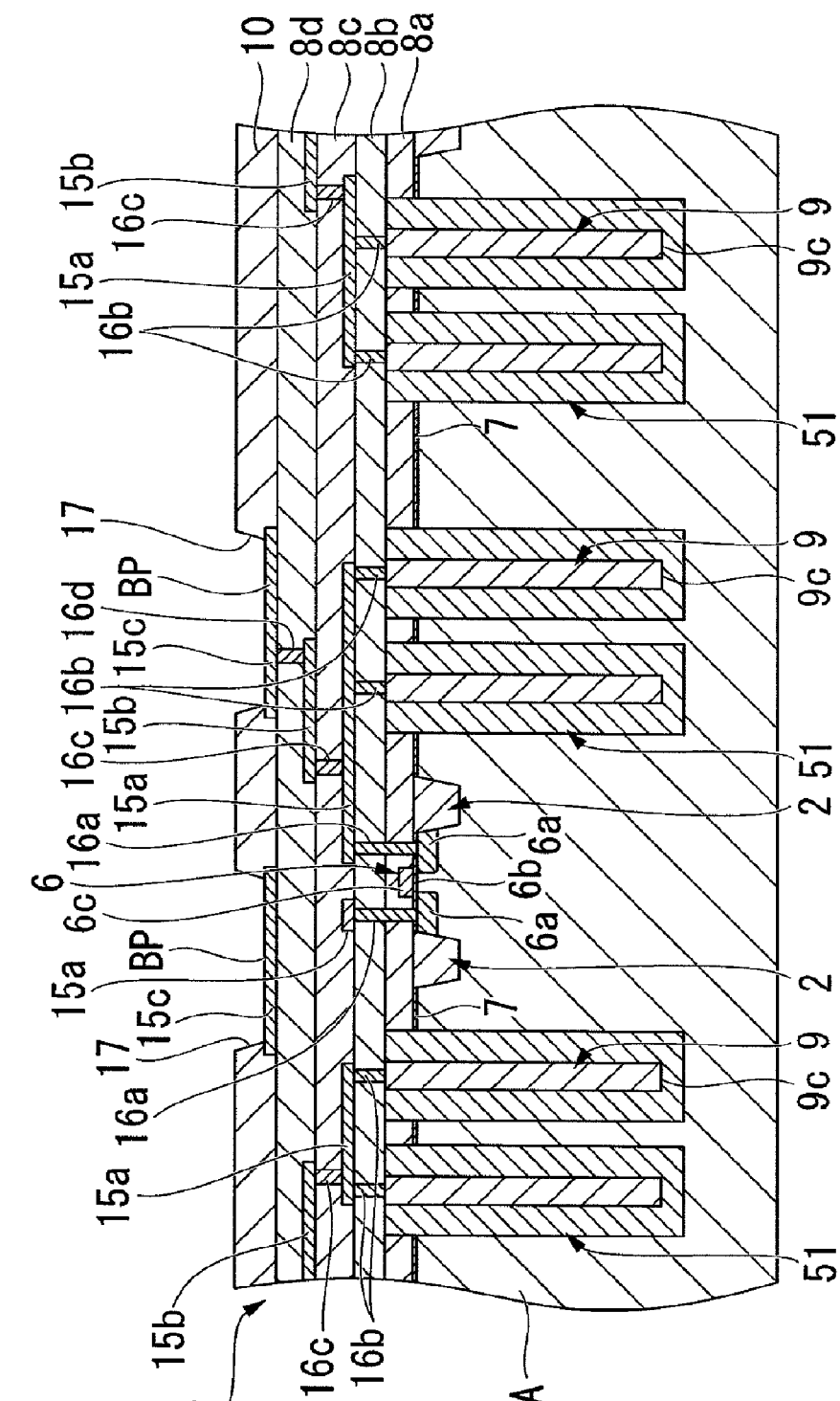
FIG. 14 is a cross-sectional view of main part of the wafer, showing a manufacturing process following the process of FIG. 13.

Next, as shown in FIG. 14, in an ordinary wiring formation method of a semiconductor device, the interlayer insulation films 8b, 8c and 8d, the surface protecting film 10, the wiring 15a, 15b and 15c, the plugs 16a, 16b, 16c and 16d, the opening 17, and the bonding pad BP are formed on the principal surface of the substrate 1SA to form a multi-layered wiring layer (process 105A in FIG. 23).

Figure 15:
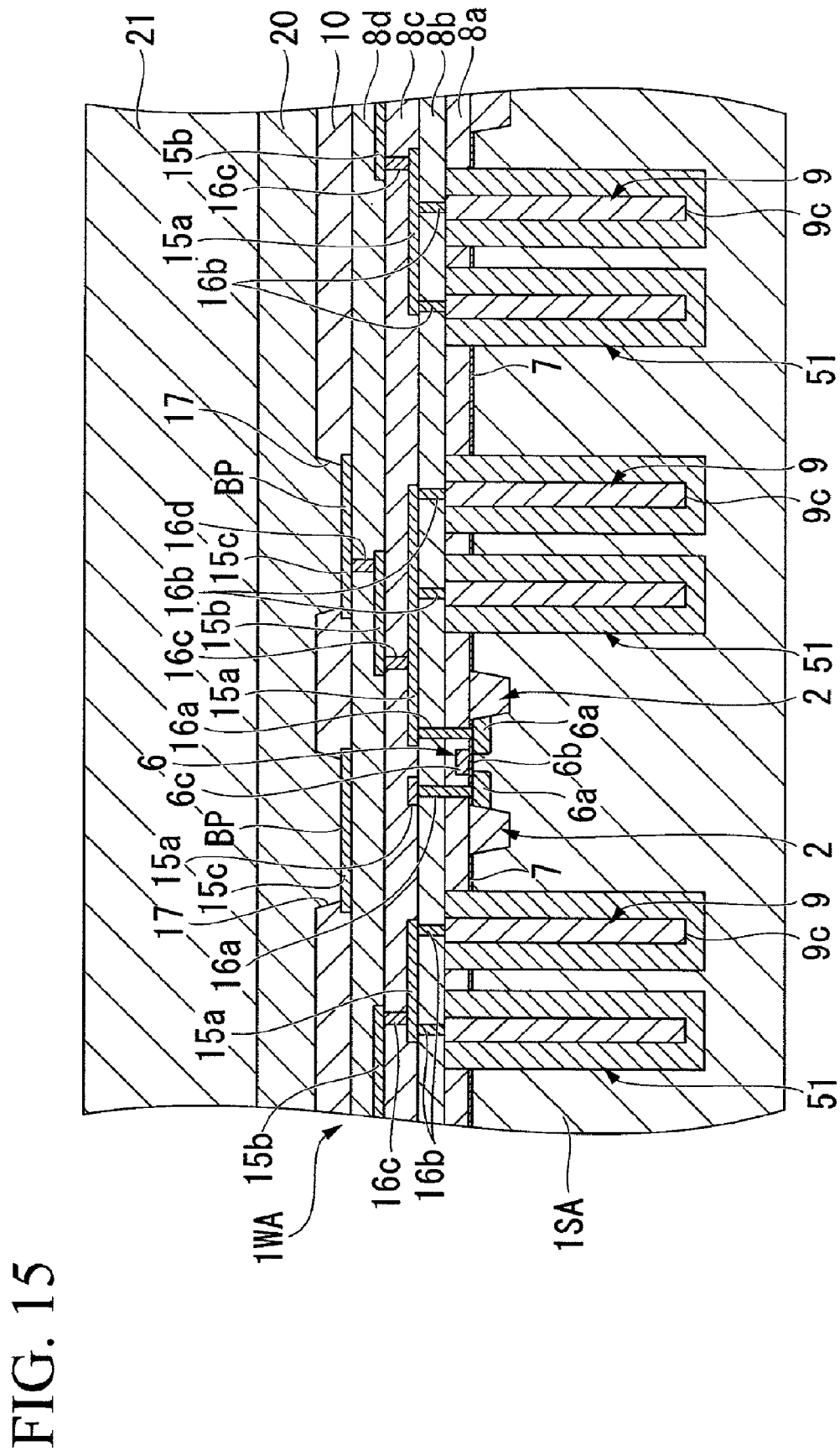
FIG. 15 is a cross-sectional view of main part of the wafer, showing a manufacturing process following the process of FIG. 14.

Then, as shown in FIG. 15, a glass support substrate 21 is made to adhere to the principal surface of the wafer 1WA via an adhesive sheet 20 and a thickness of the wafer 1WA is reduced (process 107A in FIG. 23). The thickness reducing process of the wafer 1WA of the present embodiment includes the following first thickness reducing processes and the second thickness reducing process.

Figure 16:
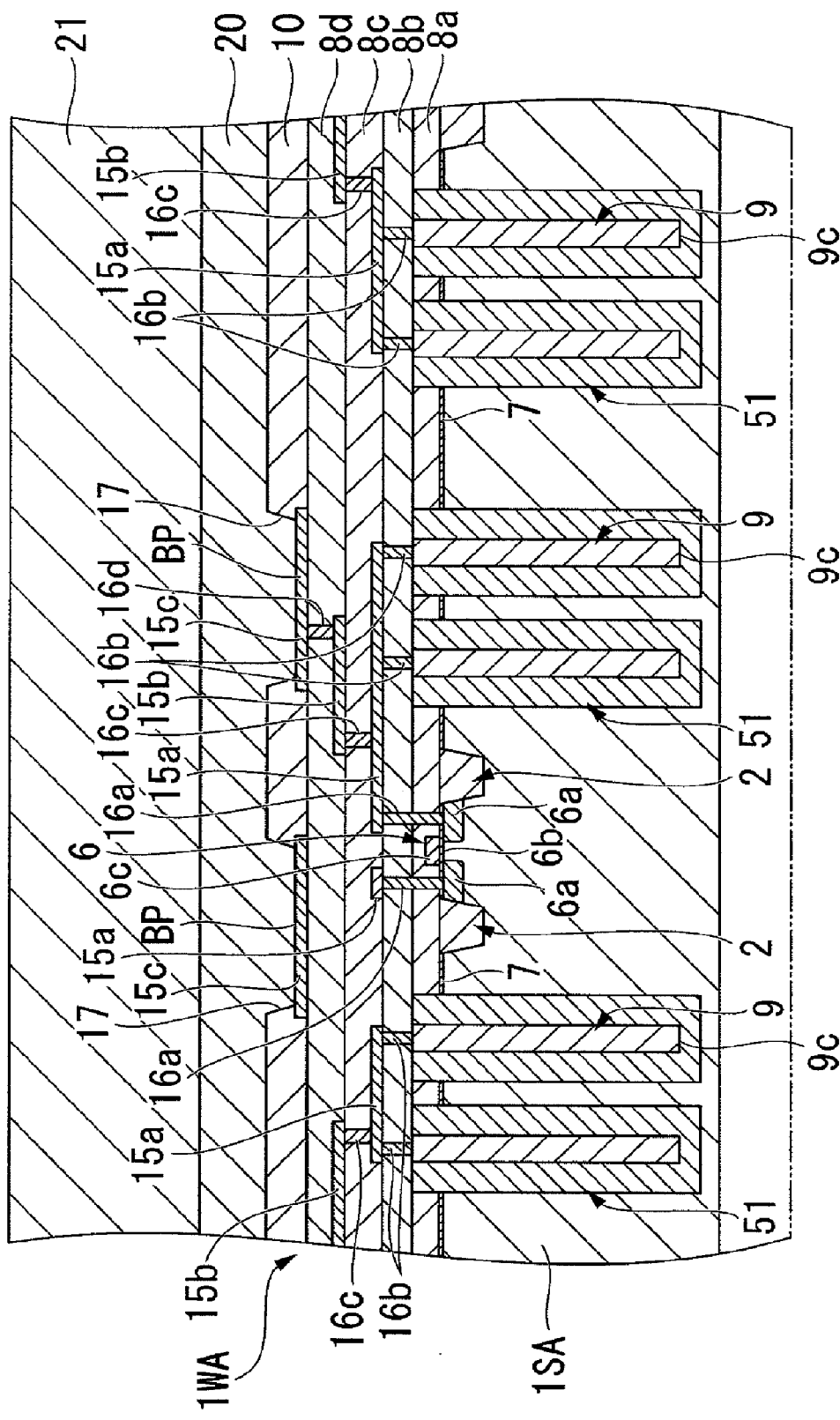
FIG. 16 is a cross-sectional view of main part of the wafer, showing a manufacturing process following the process of FIG. 15.

A dashed line in FIG. 16 shows the substrate 1SA before being subject to the first thickness reducing process. In the first thickness reducing process, as shown in FIG. 16, the back surface of the wafer 1WA (i.e., the back surface of the substrate 1SA) is ground to a desired thickness with the glass support substrate 21 fixed to the principal surface of the wafer 1WA. The first thickness reducing process is a mechanical process including grinding. The first thickness reducing process is completed before reaching the through-hole separating section 51 (i.e., before the through-hole separating section 51 is exposed from the back surface of the wafer 1WA).

Figure 17:
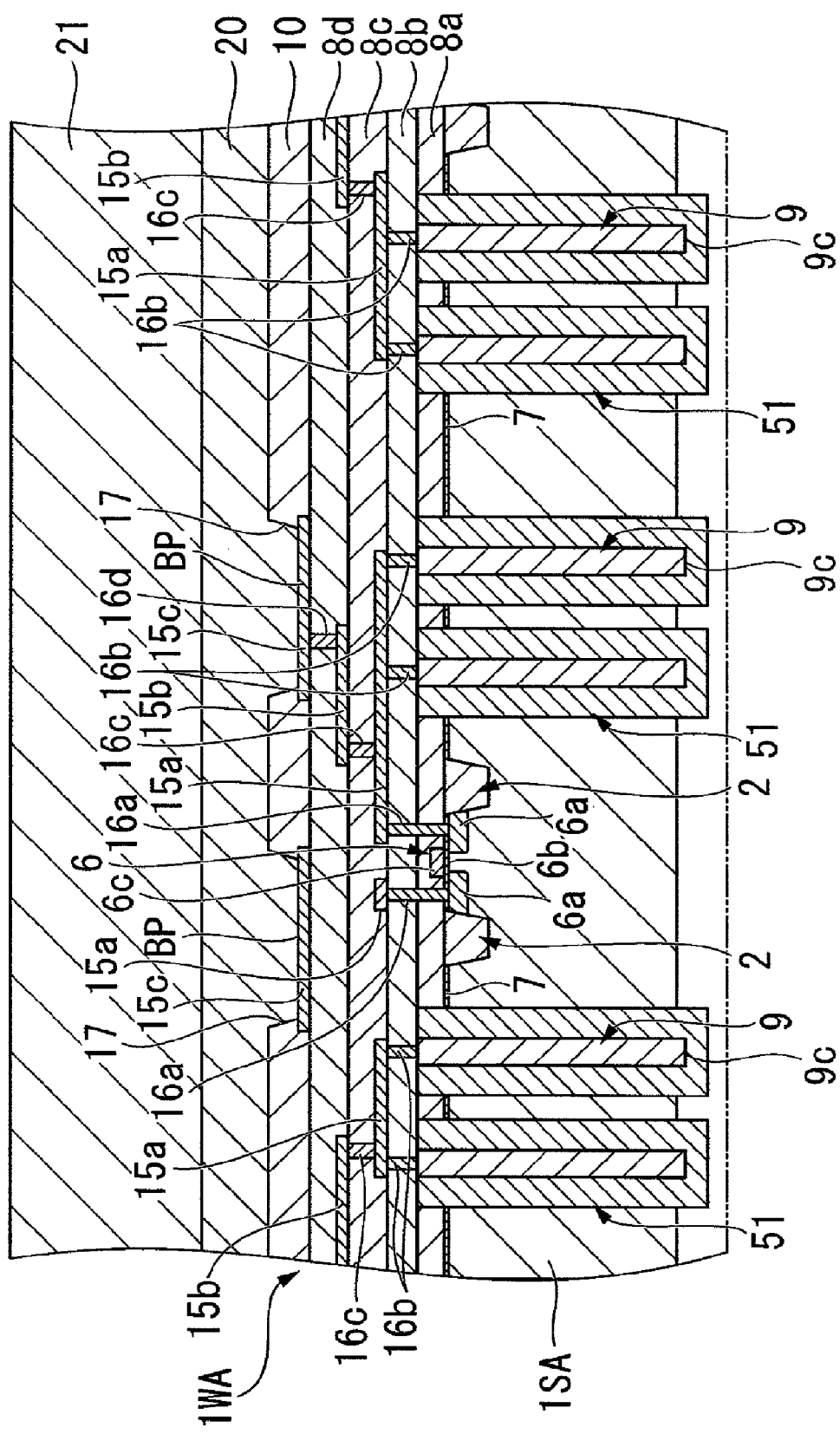
FIG. 17 is a cross-sectional view of main part of the wafer, showing a manufacturing process following the process of FIG. 16.

In the second thickness reducing process, the back surface of the wafer 1WA is subject to etching (wet etching, dry etching or both) with the glass support substrate 21 fixed to the principal surface of the wafer 1WA. A dashed line in FIG. 17 shows the substrate 1SA before being subject to the second thickness reducing process.

First, the back surface of the wafer 1WA is immersed in a chemical solution for etching the wafer 1WA so as to wet-etch the substrate 1SA. As a result of the etching, the through-hole separating section 51 is exposed from the back surface of the wafer 1WA as shown in FIG. 17.

Figure 18:
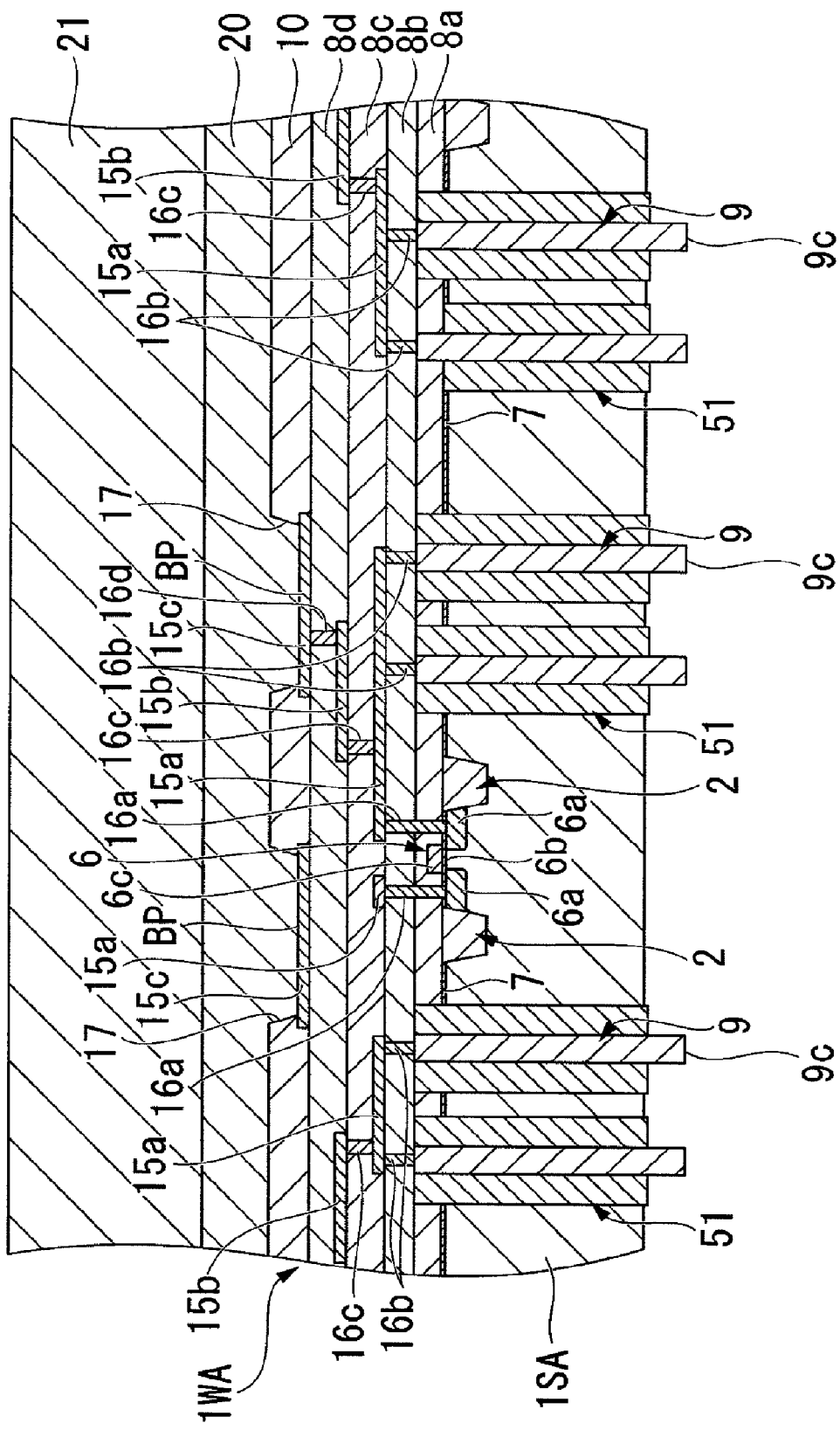
FIG. 18 is a cross-sectional view of main part of the wafer, showing a manufacturing process following the process of FIG. 17.

Next, the back surface of the wafer 1WA is immersed in a chemical solution for etching the through-hole separating section 51 so as to wet-etch a portion of the through-hole separating section 51 exposed from the back surface of the wafer 1WA. As a result of the etching, the end 9c of the through-hole interconnecting section 9 is exposed from the back surface of the wafer 1WA as shown in FIG. 18.

Finally, the back surface of the wafer 1WA is etched by immersing in a chemical solution so as to expose the through-hole separating section 51 and the through-hole interconnecting section 9 from the back surface of the wafer 1WA.

Figure 19:
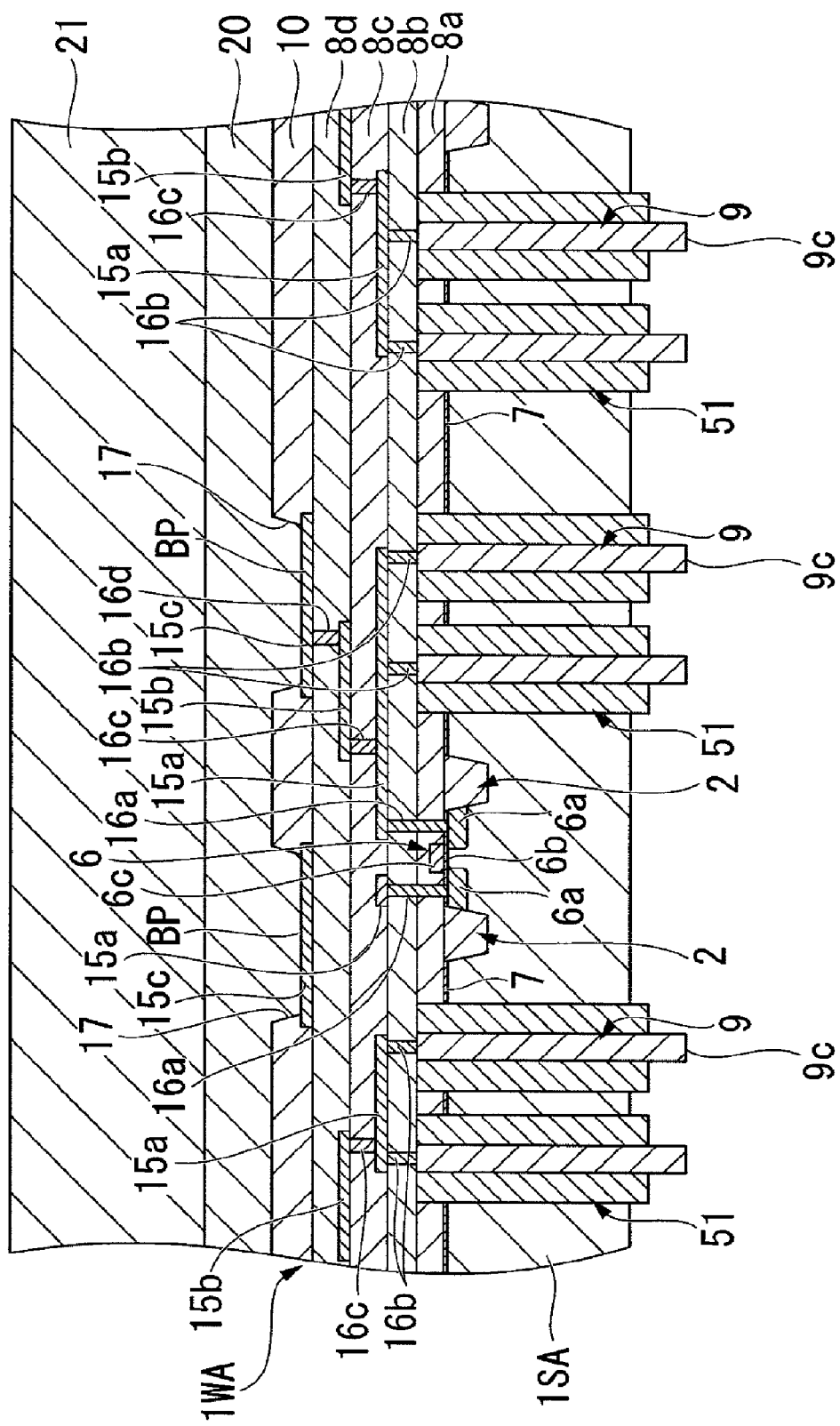
FIG. 19 is a cross-sectional view of main part of the wafer, showing a manufacturing process following the process of FIG. 18.

FIG. 19 is a cross-sectional view of main part of the upper wafer 1WA after being subject to the second thickness reducing process. In the upper wafer 1WA after being subject to the second thickness reducing process, lower parts of the through-hole separating section 51 and the through-hole interconnecting section 9 protrude a desired amount from the back surface of the wafer 1WA serving as the bonding surface 30a after being subject to the second thickness reducing process.

The protrusion length of the through-hole separating section 51 and the through-hole interconnecting section 9 protruding from the back surface of the wafer 1WA are not limited to those illustrated in FIG. 19.

For example, the protrusion length of the through-hole separating section 51 may be shorter than or equal to that of the through-hole interconnecting section 9. It is preferred that the protrusion length of the through-hole separating section 51 is shorter than or equal to that of the through-hole interconnecting section 9, since electrical connection between the through-hole interconnecting section 9 and the bump 26 can be easily established. It is also preferred that the through-hole separating section 51 and the through-hole interconnecting section 9 are of the same depth, since the load the through-hole interconnecting section 9 receives at the time of bonding of the upper and lower wafers 1WA and 1WB can be reduced. In this manner, the through-hole interconnecting section 9 has more sufficient rigidity to withstand the load it receives when the wafers 1WA and 1WB are bonded together.

As a result of the second thickness reducing process, the through-hole interconnecting section 9 is separated from the substrate 1SA at the side thereof by the through-hole separating section 51 and separated from the substrate 1SA at the lower portion thereof by being exposed. In this manner, the through-hole interconnecting section 9 is completely separated electrically from the substrate 1SA. In this stage, the deep separation groove 5a becomes a hole penetrating through the main surface and the back surface of the substrate 1SA.

In the above-described example, the first thickness reducing process (i.e., grinding) and the second thickness reducing process (i.e., etching) are conducted in this order in the thickness reducing process of the wafer 1WA. However, the first thickness reducing process (i.e., grinding) may be omitted.

The described second thickness reducing process includes three etching processes. However, the substrate 1SA and the through-hole separating section 51 may be etched in one etching process to complete the process. The substrate 1SA and the through-hole separating section 51 may also be etched in two etching processes. The substrate 1SA may be first etched and then the through-hole separating section 51 is etched to complete the process.

In this manner, the manufacturing process of the upper wafer 1WA is completed.

Next, the lower wafer is manufactured. As a lower wafer, a lowermost wafer (i.e., a lower wafer manufacturing process above the second layer in FIG. 23) of which back surface is not bonded to another wafer will be described in the manufacturing process. The manufacturing process of the lower wafer, which is the lowermost wafer, is almost the same as that of the upper wafer 1WA (processes 100A to 107A in FIG. 23) except for the following points. In the manufacturing process of the lowermost wafer, a bump formation process (process 106B) is conducted after a formation process (process 105B) of a multi-layer wiring layer shown in FIG. 23. The manufacturing process of the lowermost wafer includes no formation process (process 102B) of the through-hole separating section or formation process (process 104B) of the through-hole interconnecting section. The manufacturing process of the lowermost wafer includes no wafer thickness reducing process (process 107A) for making the through-hole interconnection on the back protrude.

Figure 20:
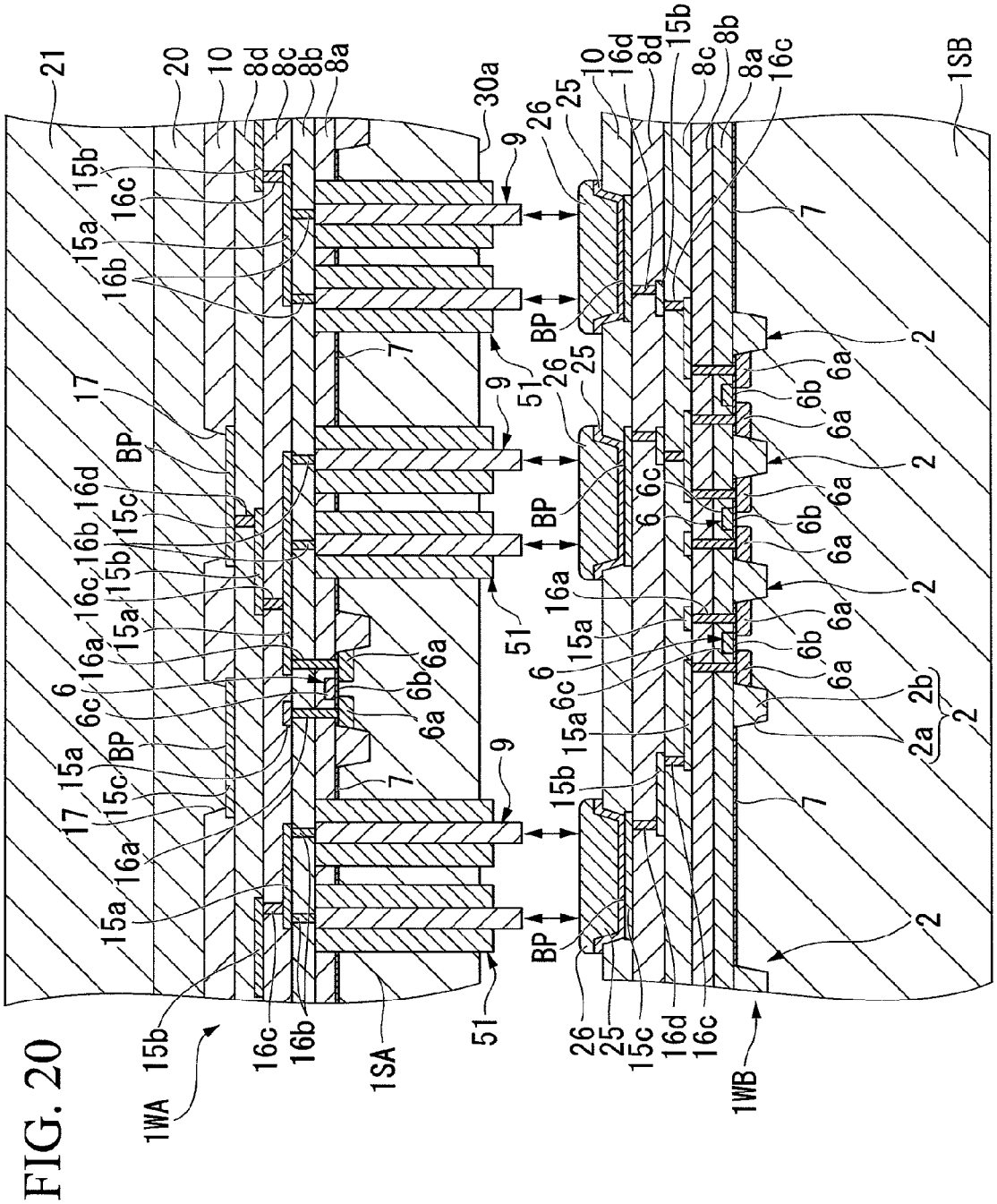
FIG. 20 is a cross-sectional view of main part of a bonding process of upper and lower wafers according to the present embodiment.

Next, the thus-manufactured upper and lower wafers 1WA and 1WB are bonded together (an upper and lower wafer bonding process of the first and second layers in FIG. 23). First, after the lower wafer 1WB is fixed, the upper wafer 1WA shown in FIG. 19 is disposed over the principal surface (i.e., the bonding surface 30b) of the lower wafer 1WB so that the back surface (i.e., the bonding surface 30a) of the upper wafer 1WA faces the principal surface of the lower wafer 1WB as shown in FIG. 20.

Then, the upper wafer 1WA and the lower wafer 1WB are aligned with each other. In particular, the bump 26 on the principal surface of the lower wafer 1WB and the through-hole interconnecting section 9 on the back surface of the upper wafer 1WA corresponding to the bump 26 are aligned with each other (process 201 in FIG. 23). Reference numeral 302 in FIG. 23 denotes the bonding process of the upper and lower wafers (i.e., the lower wafer 1WB and the upper wafer 1WA) of the first and second layers.

Figure 21:
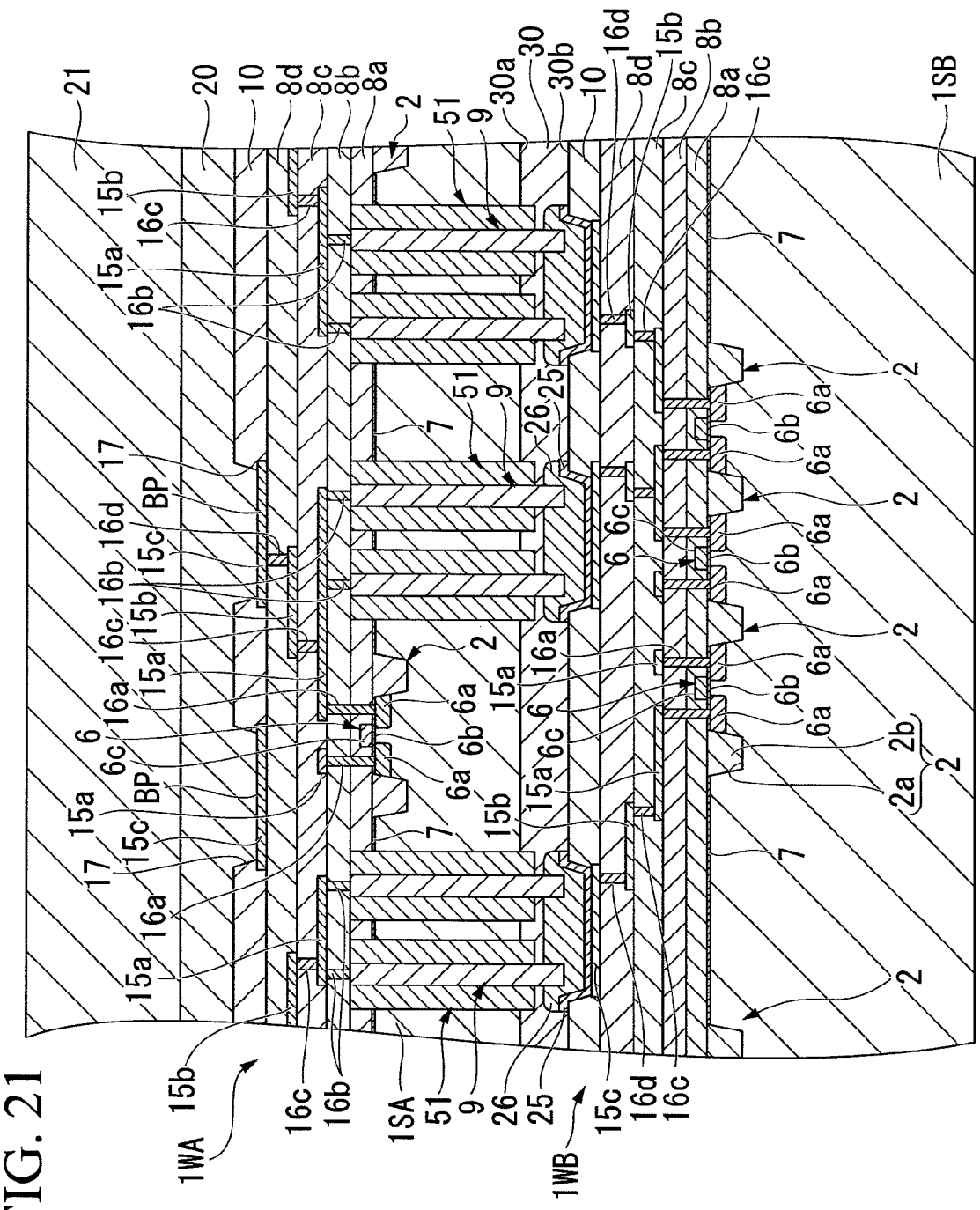
FIG. 21 is a cross-sectional view of main part of the bonding process following the process of FIG. 20.

Subsequently, as shown in FIG. 21, the oppositely facing surfaces (i.e., the bonding surfaces 30a and 30b) of the upper and lower wafers 1WA and 1WB are moved closer to each other so as to stack the lower wafer 1WB and upper wafer 1WA. The bump 26 on the principal surface of the lower wafer 1WB and the end 9c of the through-hole interconnecting section 9 on the back surface of the upper wafer 1WA become in contact with each other and are connected electrically. In this manner, semiconductor circuit sections of the upper and lower wafers 1WA and 1WB are electrically connected to each other to form a desired semiconductor circuit (process 202 in FIG. 23).

In the present embodiment, the interval between the bonding surfaces 30a and 30b is sufficiently larger than the height of the bump 26. Thus, the wafer 1WA and the bump 26 are not in contact with each other. The insulating adhesive 30 is then placed between the oppositely facing bonding surfaces 30a and 30b of the upper and lower wafers 1WA and 1WB to fix the wafers 1WA and 1WB (process 203 in FIG. 23).

Then, the glass support substrate 21 is separated from the principal surface of the upper wafer 1WA to provide the semiconductor device shown in FIG. 22.

After these processes, the semiconductor device shown in FIG. 22 is cut into chips. The thus-obtained chip has a three-dimensional structure that includes plural wafers stacked together. That is, the semiconductor circuits formed on the wafers included in the chips are electrically connected to each other via the through through-hole interconnecting section 9 and the bump 26 so as to collectively form a semiconductor integrated circuit.

Since the through-hole interconnecting section 9 has a cross section with two or more straight lines extending in different directions, the upper wafer 1WA according to the present embodiment is less easily damaged even if the through-hole interconnecting section 9 receives load when the wafers 1WA and 1WB are bonded together.

Also in the through-hole interconnection structure of the upper wafer 1WA according to the present embodiment, since the through-hole separating section 51 which surrounds the through-hole interconnecting section 9 is provided on and protrudes from the bonding surface 30a, the through-hole interconnecting section 9 can be reinforced by the through-hole separating section 51. With this configuration, damage to the through-hole interconnecting section 9 caused when the upper and lower wafers 1WA and 1WB are bonded together can be prevented more effectively.

In the through-hole interconnection structure according to the present embodiment, since the through-hole separating section 51 and the through-hole interconnecting section 9 are integrally formed, the through-hole interconnecting section 9 can be effectively reinforced by the through-hole separating section 51.

Figure 24:
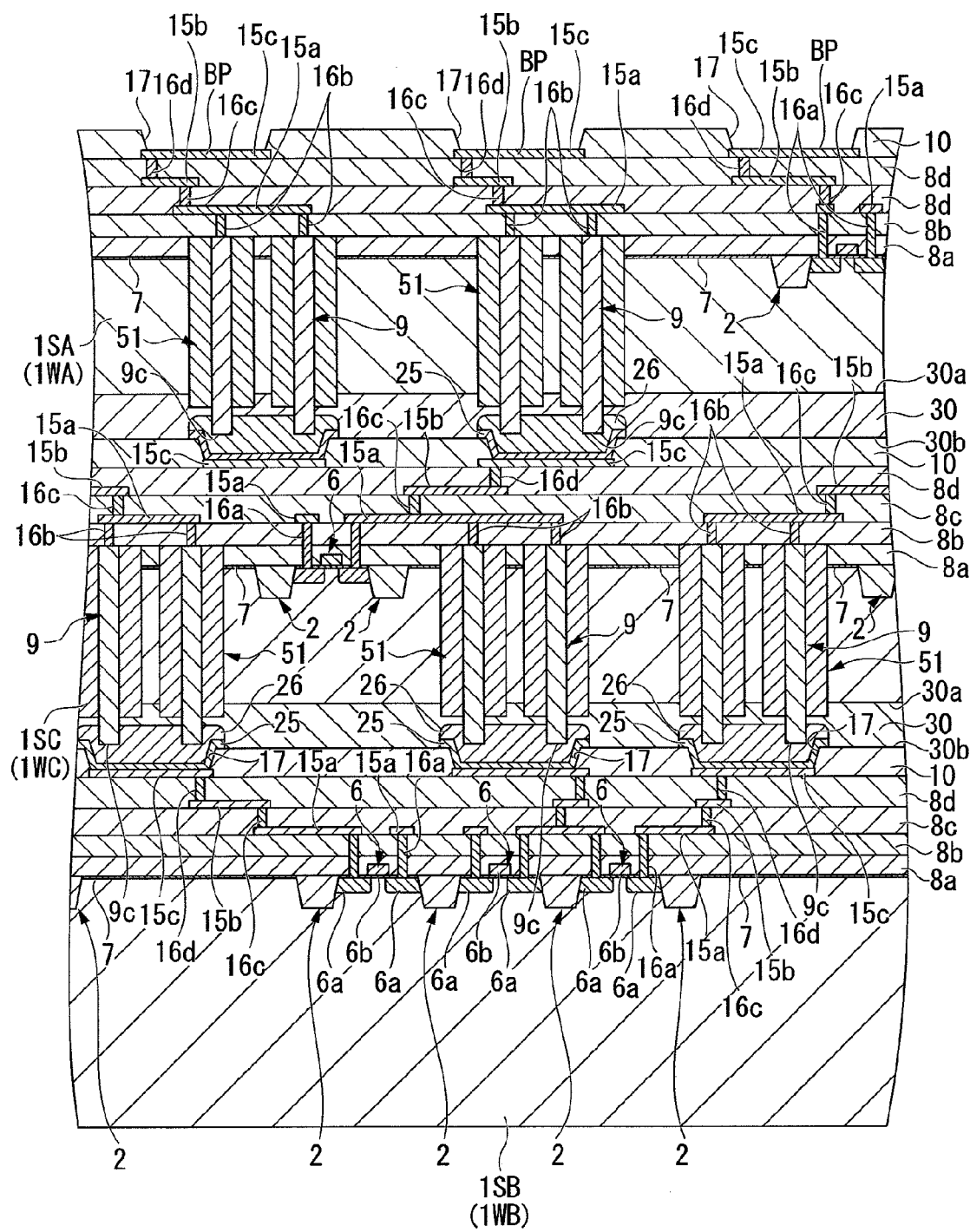
FIG. 24 is a cross-sectional view of main part of another exemplary semiconductor device including a through-hole interconnection structure of a semiconductor wafer according to an embodiment of the invention.

It should be noted that the present invention is not limited only to the examples described above. For example, although the example shown in FIG. 22 relates to the semiconductor device with two wafers 1WA and 1WB bonded together, the number of the wafers to be bonded is not limited to two, and three or more wafers may be bonded. FIG. 24 is a cross-sectional view of main part of another exemplary semiconductor device which includes a through-hole interconnection structure according to the invention. The semiconductor device shown in FIG. 24 is a three-dimensional multi-layered structure semiconductor device in which three substrates 1SA, 1SB and 1SC are stacked. In the semiconductor device shown in FIG. 24, the same members as those shown in FIG. 22 are denoted by the same reference numerals and description thereof will be omitted.

Next, an exemplary manufacturing process of the semiconductor device shown in FIG. 24 will be described with reference to FIG. 23. First, an uppermost wafer 1WA and a lowermost wafer 1WB are prepared in the same manner as in the manufacturing process of the semiconductor device shown in FIG. 22.

An middle wafer 1WC is prepared in the processes 100B to 106B shown in FIG. 23. The middle wafer 1WC (i.e., the semiconductor wafer) also includes a through-hole separating section 51 and a through-hole interconnecting section 9 as in the uppermost wafer 1WA. The middle wafer 1WC differs from the uppermost wafer 1WA in that a conductive pattern 25 underlying the bump and a bump 26 are formed on a principal surface of the middle wafer 1WC. The middle wafer 1WC in this stage has not been subject to the first and second thickness reducing processes and thus is still thick.

Then, two wafers 1WA and 1WC are aligned with each other as in the manufacturing method of the semiconductor device shown in FIG. 22. An adhesive 30 is placed between the wafer 1WA and 1WC. The wafers 1WA and 1WC are fixed together (process 201, 202 and 203 for bonding upper and lower wafers above the third layer in FIG. 23).

Subsequently, a thickness of the lower middle wafer 1WC is reduced from the backside thereof in a thickness reducing process as described above with the glass support substrate 21 bonded to the principal surface of upper uppermost wafer 1WA (process 107A in the middle in FIG. 23). In this manner, the through-hole separating section 51 and the through-hole interconnecting section 9 are exposed (i.e., protrude) from the back surface (i.e., the bonding surface 30a) of the lower middle wafer 1WC.

Then, the middle wafer 1WC and the lowermost wafer 1WB are aligned with each other with the glass support substrate 21 bonded to the principal surface of the upper uppermost wafer 1WA. The adhesive 30 is placed between the wafers 1WC and 1WB to fix the wafers 1WC and 1WB (processes 201 to 203 in the lower middle in FIG. 23). Subsequent processes are the same as described above and description thereof will be omitted. When four or more wafers are to be bonded together, the process conducted for the middle wafer 1WC and the wafer bonding process may be repeated as required.

In the semiconductor device shown in FIG. 24, the wafers 1WA and 1WC include the through-hole interconnecting section 9 having sufficient rigidity to withstand the load it receives when the wafers 1WA and 1WC are bonded together. Thus, the through-hole interconnecting section 9 is less easily damaged when the wafers 1WA, 1WC and 1WB are bonded together. With this configuration, the semiconductor device is excellent in reliability and stability of performance.

While preferred embodiments of the invention have been described and illustrated above and it should be understood that these are exemplary of the invention and are not to be considered as limiting. Additions, omissions and substitutions, and other modifications can be made without departing from the spirit or scope of the present invention. Accordingly, the invention is not to be considered as being limited by the foregoing description, and is only limited by the scope of the appended claims.

What is claimed is:

1. A through-hole interconnection structure for a semiconductor wafer which includes a plurality of wafers bonded together, each of the plurality of wafers including a substrate with a device formed thereon, wherein:

the semiconductor wafer comprises at least a first wafer and a second wafer electrically connected to the first wafer;

a through-hole separating section penetrating through the substrate of the first wafer, said through-hole separating section includes an interior space;

an electrical signal connecting section of the second wafer is provided to protrude from a bonding surface of the second wafer, the bonding surface being bonded with the first wafer; and the electrical signal connecting section extending through the through-hole separating-section, said electrical signal connecting section having a cross section with a curved line or two or more straight lines extending in different directions when the second wafer is seen along a cross section parallel to the bonding surface wherein the curved line or two or more straight lines are spaced a predetermined interval within the interior space of said through-hole separating section;

wherein the interior space of said through-hole separating section is filled with the substrate of the first wafer which divides the electrical signal connecting section and the through-hole separating section.

2. The through-hole interconnection structure for a semiconductor wafer according to claim 1, wherein the through-hole separating section surrounds the electrical signal connecting section and is provided on and protrudes from the bonding surface.

3. The through-hole interconnection structure according to claim 2, wherein the through-hole separating section and the electrical signal connecting section are integrally formed.

4. The through-hole interconnection structure for a semiconductor wafer according to claim 3, wherein a contour of the through-hole separating section in a cross section parallel to the bonding surface is similar to a contour of the electrical signal connecting section.

5. The through-hole interconnection structure for a semiconductor wafer according to claim 1, wherein the through-hole separating section is formed rectilinearly with said electrical signal connecting section being spaced a predetermined interval within the interior space of said through-hole separating section.

6. The through-hole interconnection structure for a semiconductor wafer according to claim 5, wherein said electrical signal connecting section is square in cross section.

7. The through-hole interconnection structure for a semiconductor wafer according to claim 5, wherein said electrical signal connecting section is circular in cross section.

8. The through-hole interconnection structure for a semiconductor wafer according to claim 5, wherein said electrical signal connecting section includes two elements extending substantially parallel relative to each other.

9. The through-hole interconnection structure for a semiconductor wafer according to claim 5, wherein said electrical signal connecting section is cross-shaped in cross section.

10. The through-hole interconnection structure for a semiconductor wafer according to claim 5, wherein said electrical signal connecting section is H-shaped in cross section.

11. The through-hole interconnection structure for a semiconductor wafer according to claim 5, wherein said electrical signal connecting section is L-shaped in cross section.

12. The through-hole interconnection structure for a semiconductor wafer according to claim 5, wherein said electrical signal connecting section is U-shaped in cross section.

13. A through-hole interconnection structure for a semiconductor wafer which includes a plurality of wafers bonded together, each of the plurality of wafers including a substrate with a device formed thereon, comprising:

at least a first wafer;

at least a second wafer electrically connected to the first wafer;

a through-hole separating section penetrating through the substrate of the first wafer, said through-hole separating section includes an interior space;

an electrical signal connecting section of the second wafer is provided to protrude from a bonding surface of the second wafer, the bonding surface being bonded with the first wafer; and the electrical signal connecting section extending through the through-hole separating-section, said electrical signal connecting section having a cross section that is spaced a predetermined interval within the interior space of said through-hole separating section, wherein the interior space of said through-hole separating section is filled with said substrate of the first wafer which divides the electrical signal connecting section and the through-hole separating section.

14. The through-hole interconnection structure for a semiconductor wafer according to claim 13, wherein the through-hole separating section surrounds the electrical signal connecting section and is provided on and protrudes from the bonding surface.

15. The through-hole interconnection structure according to claim 14, wherein the through-hole separating section and the electrical signal connecting section are integrally formed.

16. The through-hole interconnection structure for a semiconductor wafer according to claim 15, wherein a contour of the through-hole separating section in a cross section parallel to the bonding surface is similar to a contour of the electrical signal connecting section.

17. The through-hole interconnection structure for a semiconductor wafer according to claim 13, wherein the through-hole separating section is formed rectilinearly with said electrical signal connecting section being spaced a predetermined interval within the interior space of said through-hole separating section.

18. The through-hole interconnection structure for a semiconductor wafer according to claim 17, wherein said electrical signal connecting section is square in cross section.

19. The through-hole interconnection structure for a semiconductor wafer according to claim 17, wherein said electrical signal connecting section is circular in cross section.

20. The through-hole interconnection structure for a semiconductor wafer according to claim 17, wherein said electrical signal connecting section includes two elements extending substantially parallel relative to each other.

* * * * *